United States Patent [19]

McTamaney et al.

[11] Patent Number: 4,509,901
[45] Date of Patent: Apr. 9, 1985

[54] METHOD AND APPARATUS FOR DETECTING PROBLEMS IN SUCKER-ROD WELL PUMPS

[75] Inventors: Louis S. McTamaney, Cupertino; Allan B. Delfino, Sunnyvale, both of Calif.; Gary W. Bisbee, The Woodlands, Tex.

[73] Assignee: FMC Corporation, Chicago, Ill.

[21] Appl. No.: 470,021

[22] Filed: Apr. 18, 1983

[51] Int. Cl.³ .................... F04B 49/06; E21B 47/00; G06F 15/20

[52] U.S. Cl. .................................. 417/18; 417/44; 417/53; 417/63; 73/151; 166/65 R; 166/250; 364/507; 364/550

[58] Field of Search ............... 417/1, 12, 18, 33, 44, 417/45, 53, 63; 73/151; 166/65 R, 250; 346/33 WL; 364/422, 507, 550, 551

[56] References Cited

U.S. PATENT DOCUMENTS

| | | | |
|---|---|---|---|
| 3,343,409 | 9/1967 | Gibbs | 73/151 |
| 3,824,851 | 7/1974 | Hagar et al. | 73/151 |
| 3,851,995 | 12/1974 | Mills | 417/18 X |
| 3,951,209 | 4/1976 | Gibbs | 73/151 X |
| 3,998,568 | 12/1976 | Hynd | 417/12 |
| 4,015,469 | 4/1977 | Womack et al. | 73/151 |
| 4,034,808 | 7/1977 | Patterson | 73/151 X |
| 4,102,394 | 7/1978 | Botts | 166/65 R |
| 4,143,546 | 3/1979 | Wiener | 73/151 |
| 4,194,393 | 3/1980 | Boley | 417/44 X |
| 4,208,665 | 6/1980 | Mills | 73/151 X |
| 4,286,925 | 9/1981 | Standish | 417/63 X |
| 4,302,157 | 11/1981 | Welton et al. | 417/44 X |
| 4,307,395 | 12/1981 | Standish | 166/65 R X |
| 4,363,605 | 12/1982 | Mills | 417/44 |

*Primary Examiner*—William L. Freeh
*Assistant Examiner*—Paul F. Neils
*Attorney, Agent, or Firm*—Lloyd B. Guernsey; H. M. Stanley; R. B. Megley

[57] ABSTRACT

Method and apparatus for detecting problems in sucker-rod well pumps and for determining which type of problem occurs. A first transducer provides a signal representative of the load on a sucker-rod string and a second transducer provides a signal representative of the sucker-rod position. The load signal and the position signal are used to generate a dynagraph of rod load vs. rod position with the pump working normally. A working dynagraph is continually compared with the normal dynagraph and a working load signal is continually compared with a normal rod load signal to detect problems in the pumping system and to determine the type of problem detected if one does develop.

14 Claims, 29 Drawing Figures

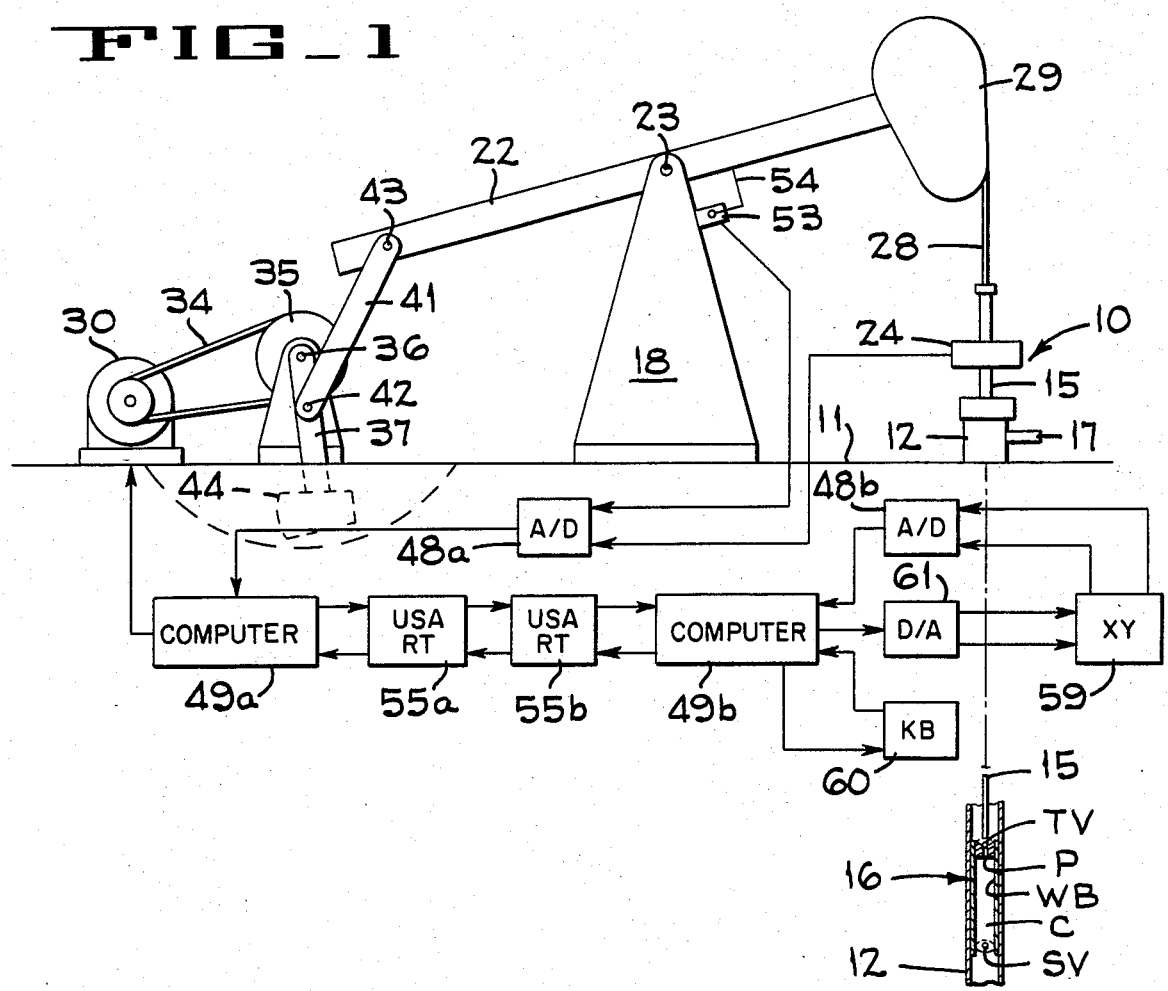
FIG_1
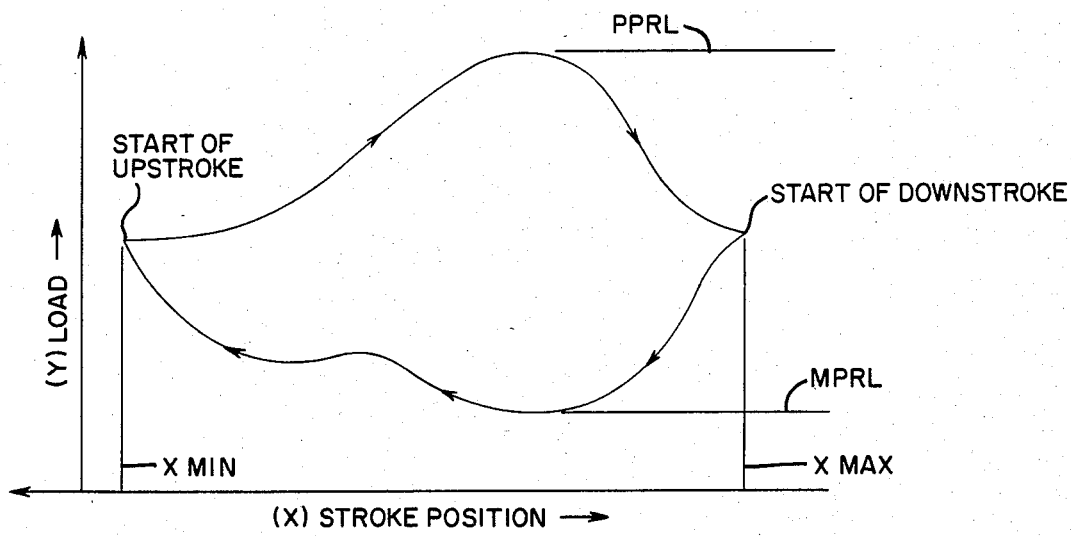
FIG_2

FIG_3
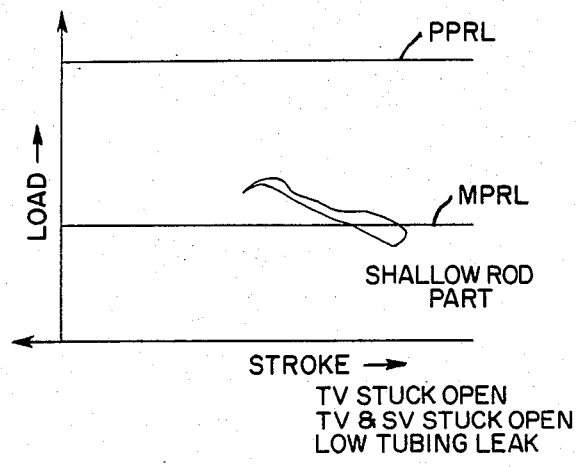
SHALLOW ROD PART
TV STUCK OPEN
TV & SV STUCK OPEN
LOW TUBING LEAK
FIG_4
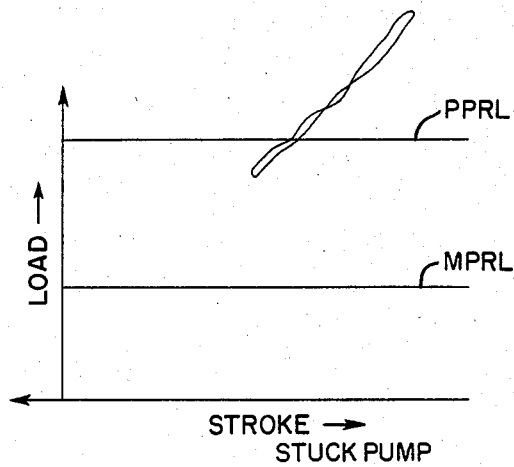
STUCK PUMP
FIG_5
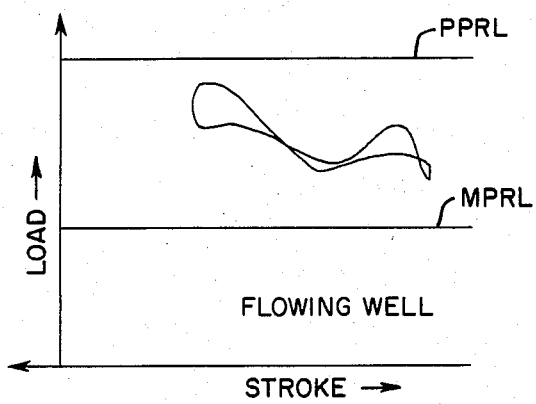
FLOWING WELL
FIG_6
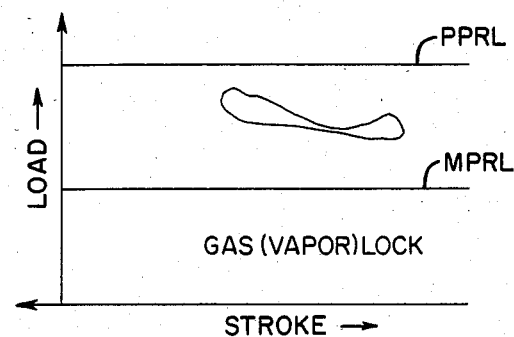
GAS (VAPOR) LOCK
FIG_7
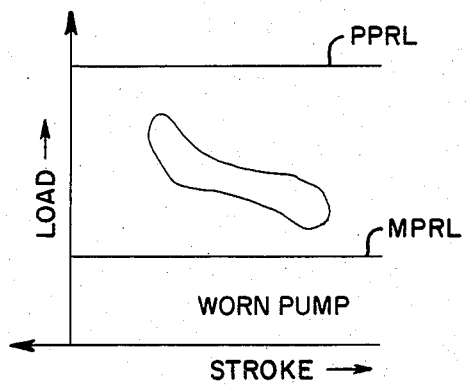
WORN PUMP
FIG_8
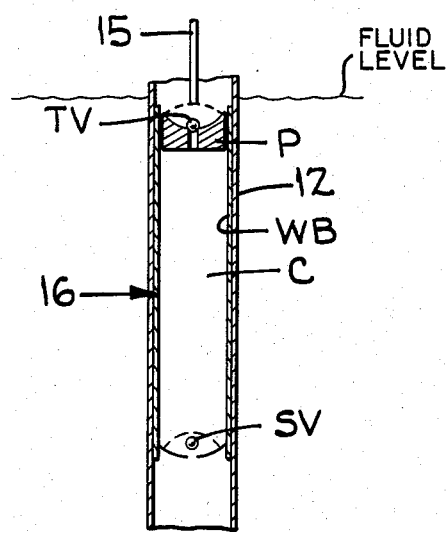

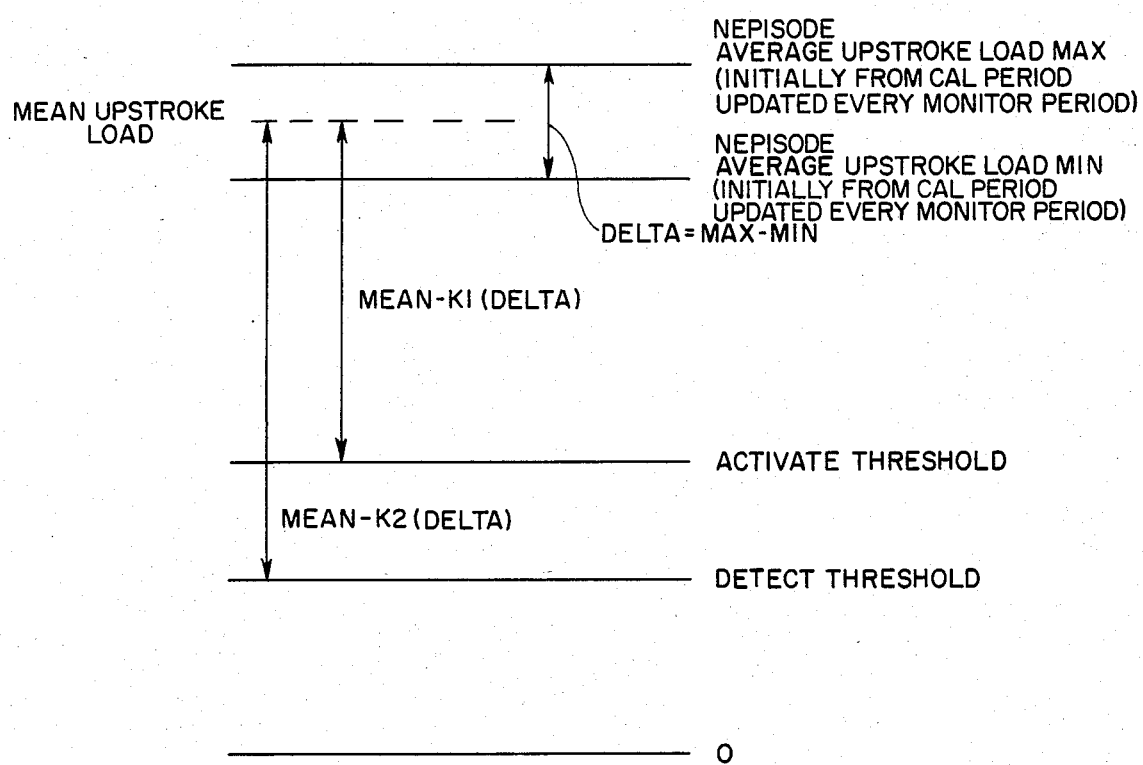

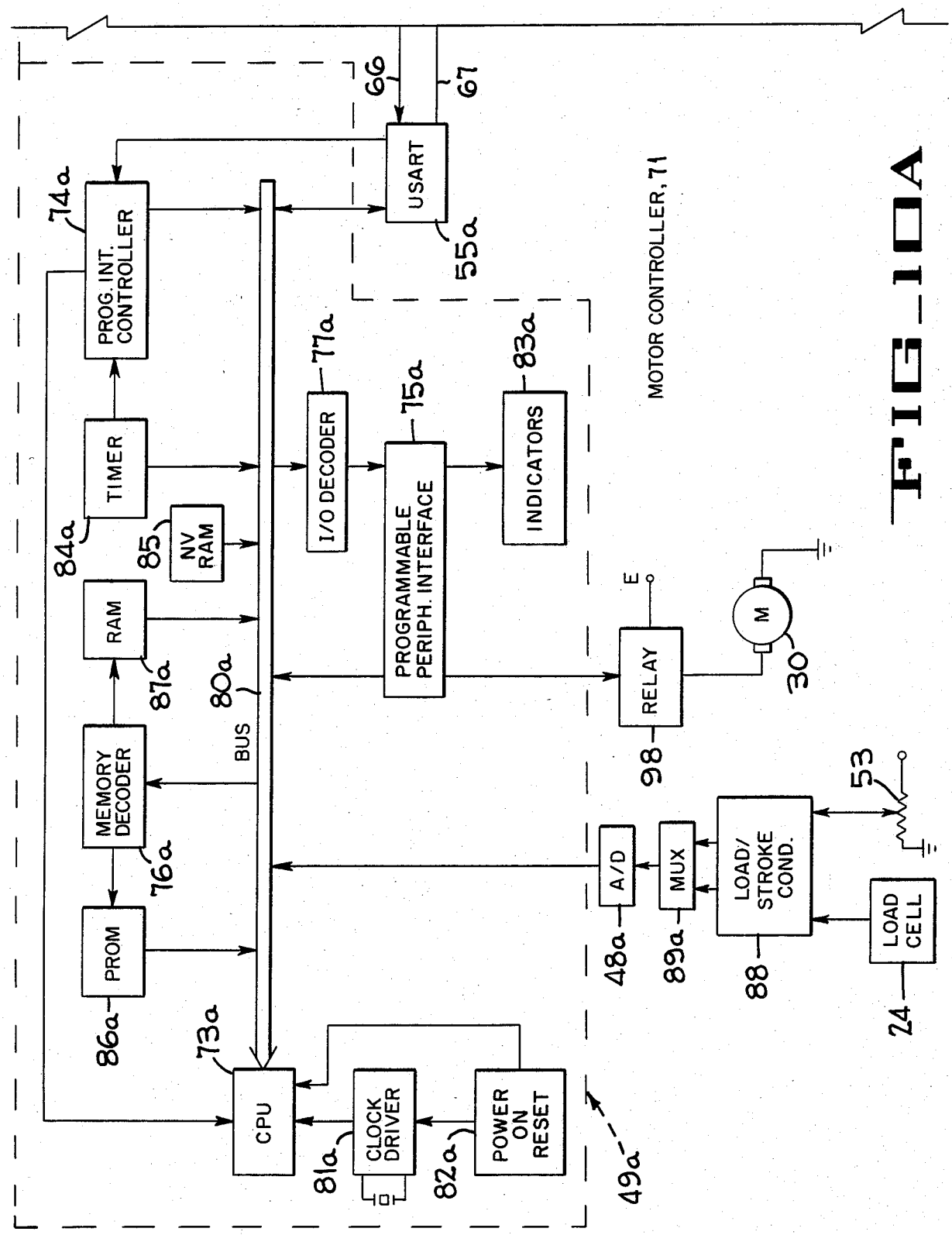

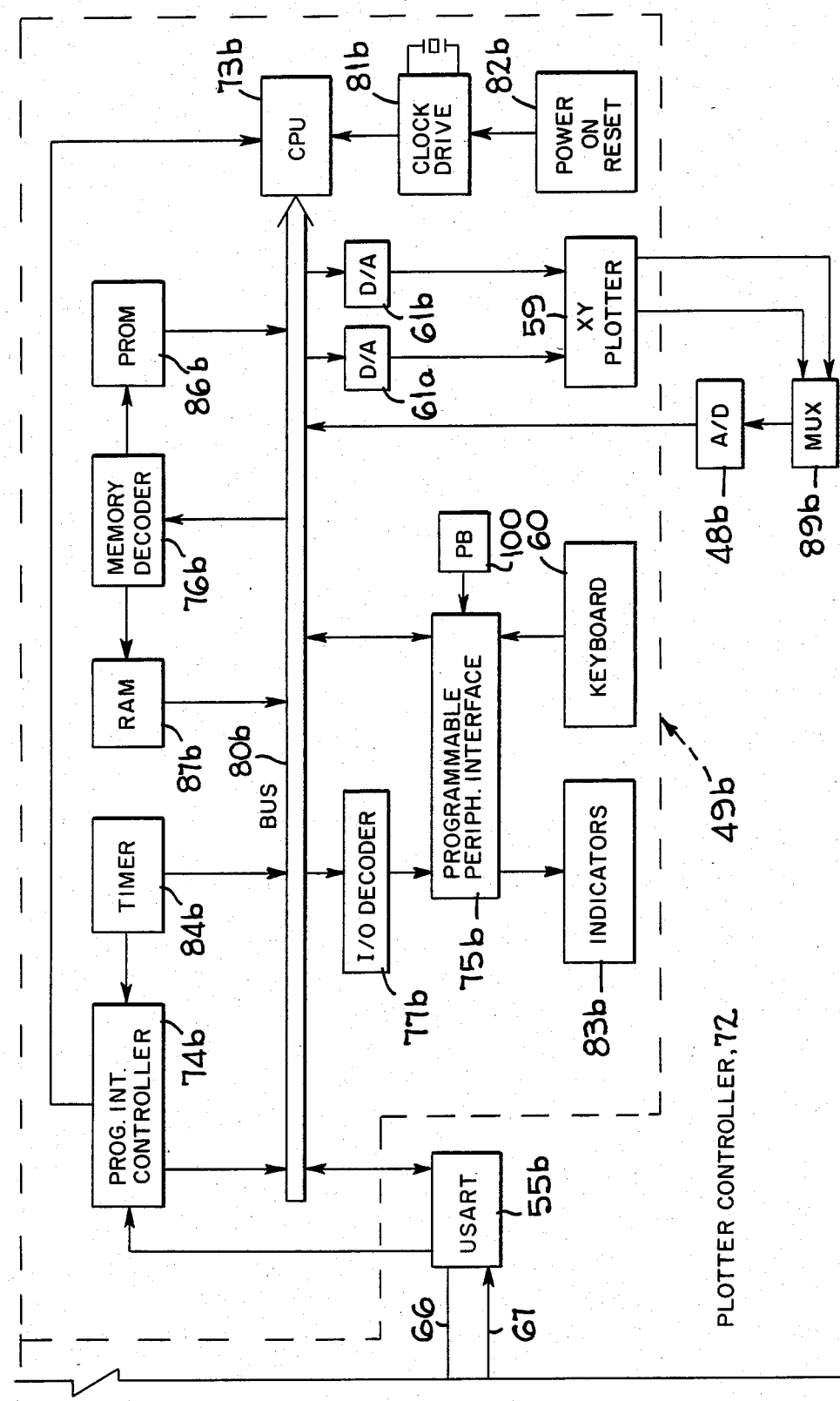
FIG_10B

|  | STATE 1 | STATE 2 | STATE 3 |
|---|---|---|---|
| MESSAGE 1 | PROCESS A | PROCESS D | PROCESS G |
| MESSAGE 2 | PROCESS B | PROCESS E | PROCESS H |
| MESSAGE 3 | PROCESS C | PROCESS F | PROCESS I |
FIG_11
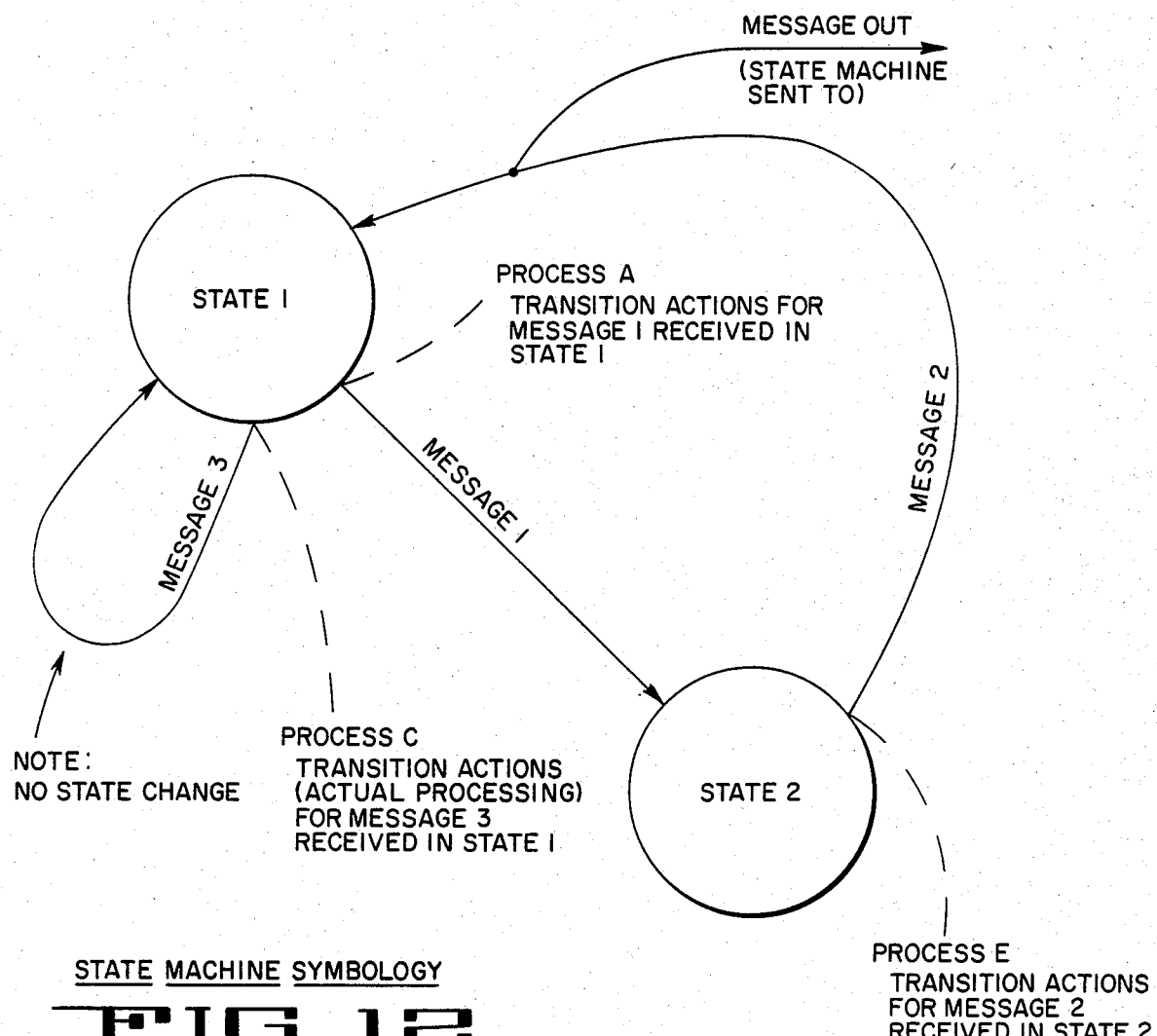
STATE MACHINE SYMBOLOGY
FIG_12

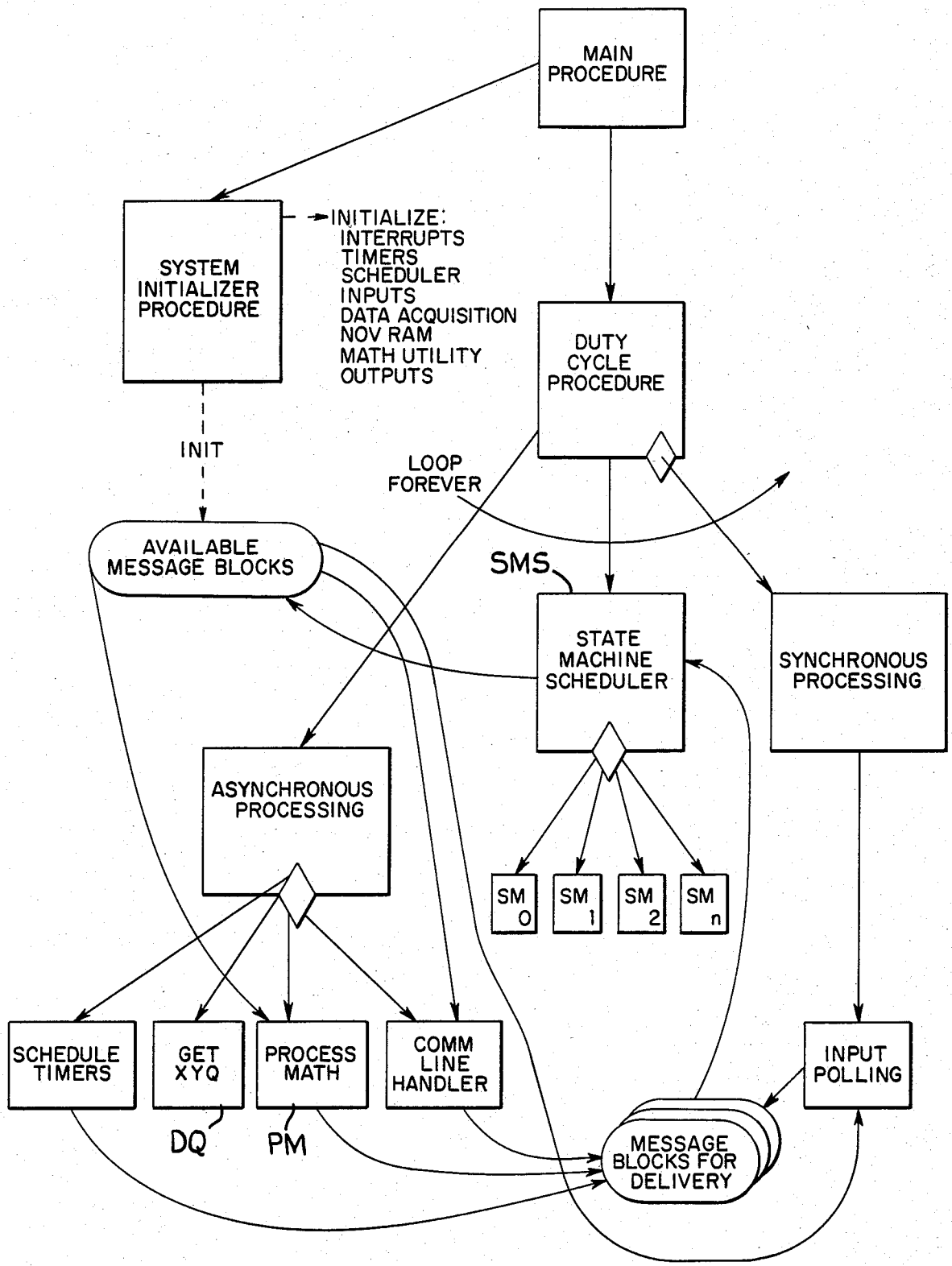

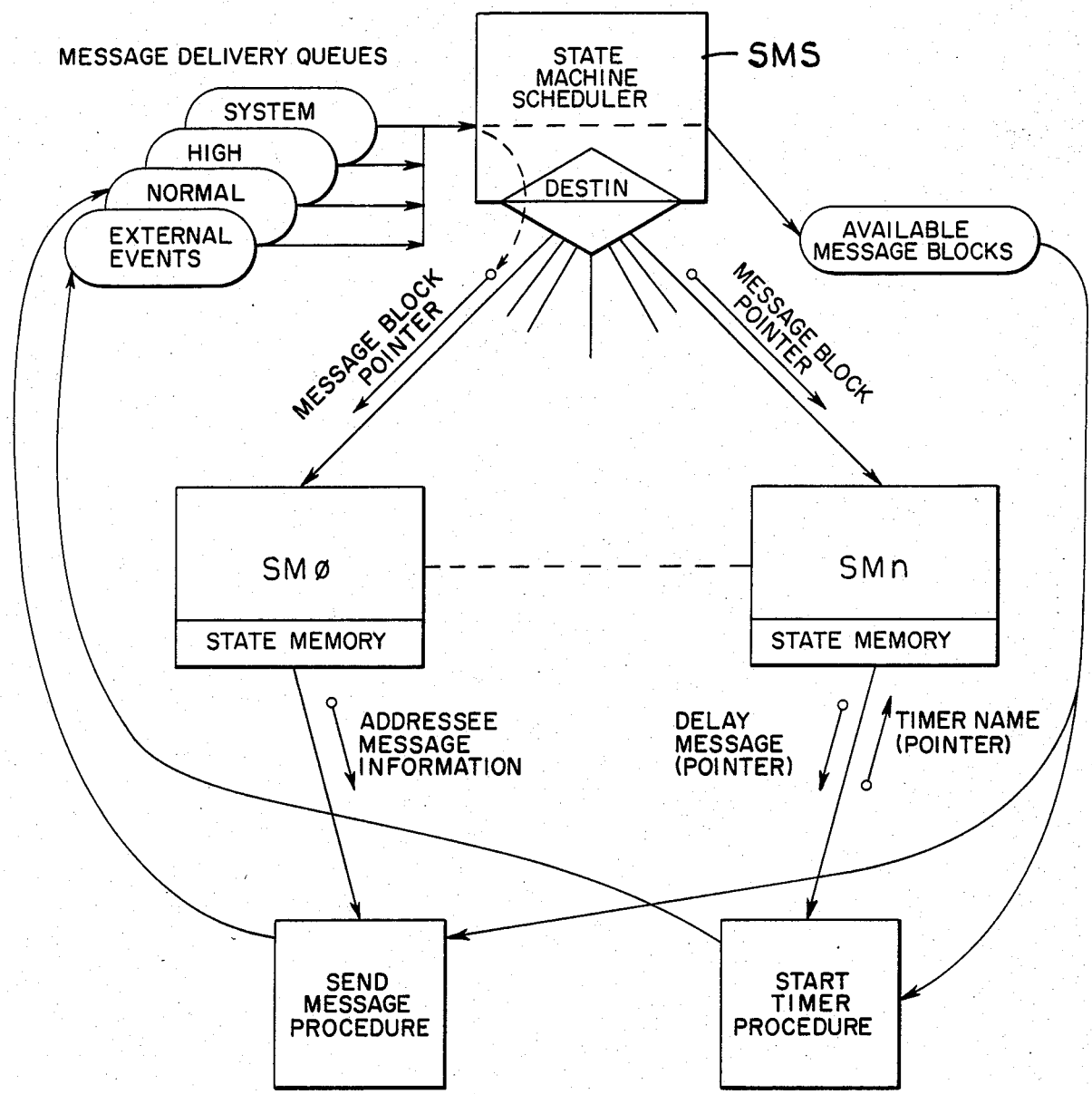

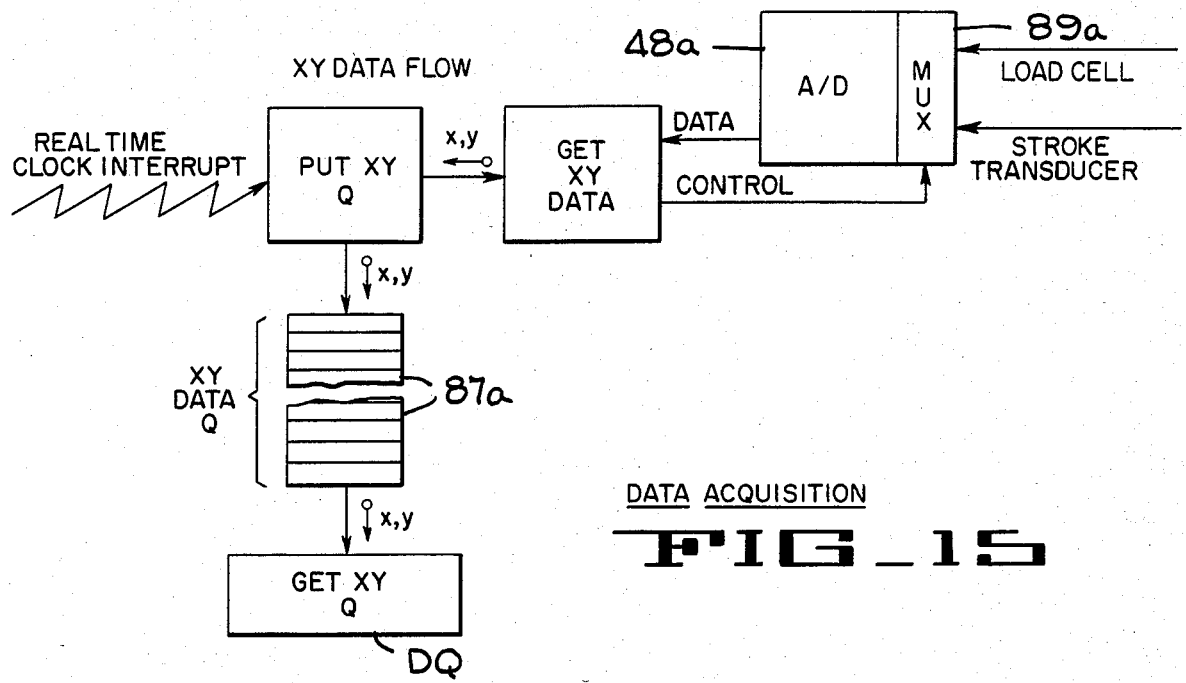
DATA ACQUISITION
FIG_15
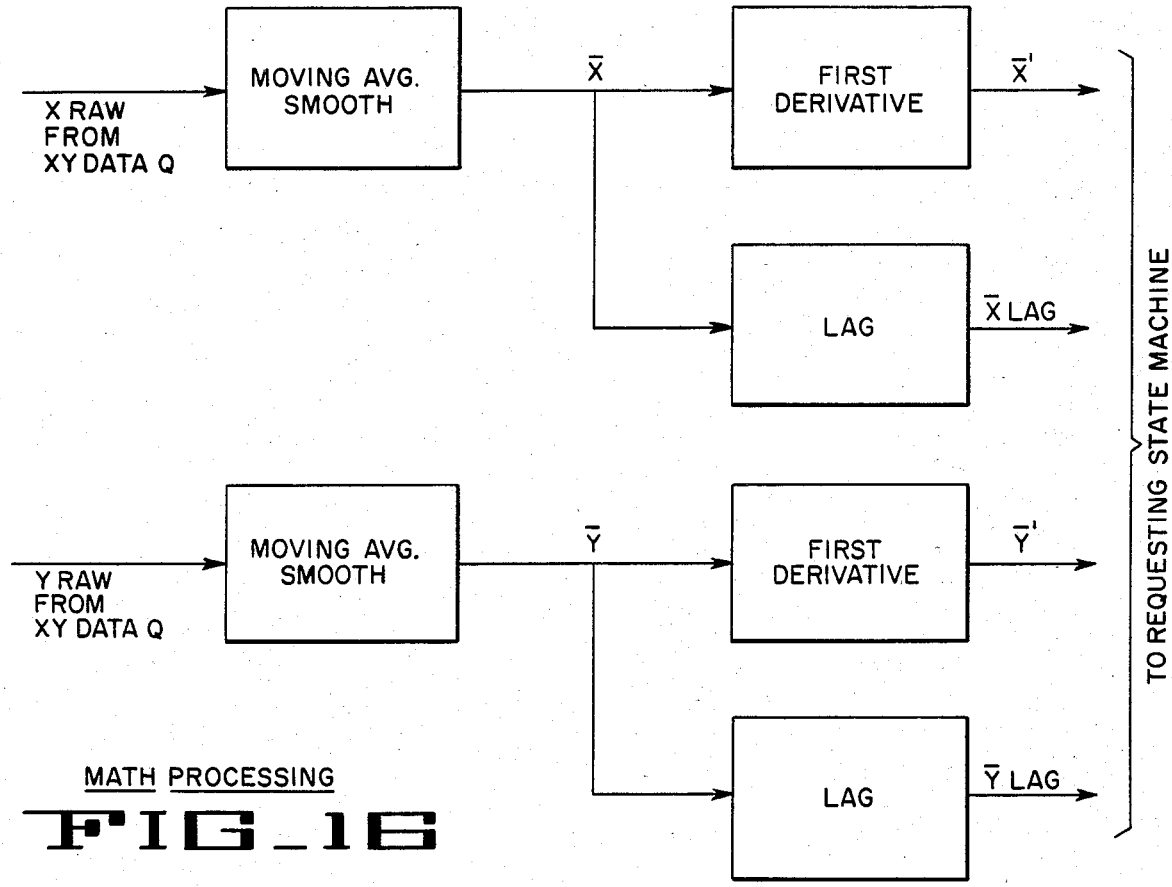
MATH PROCESSING
FIG_16

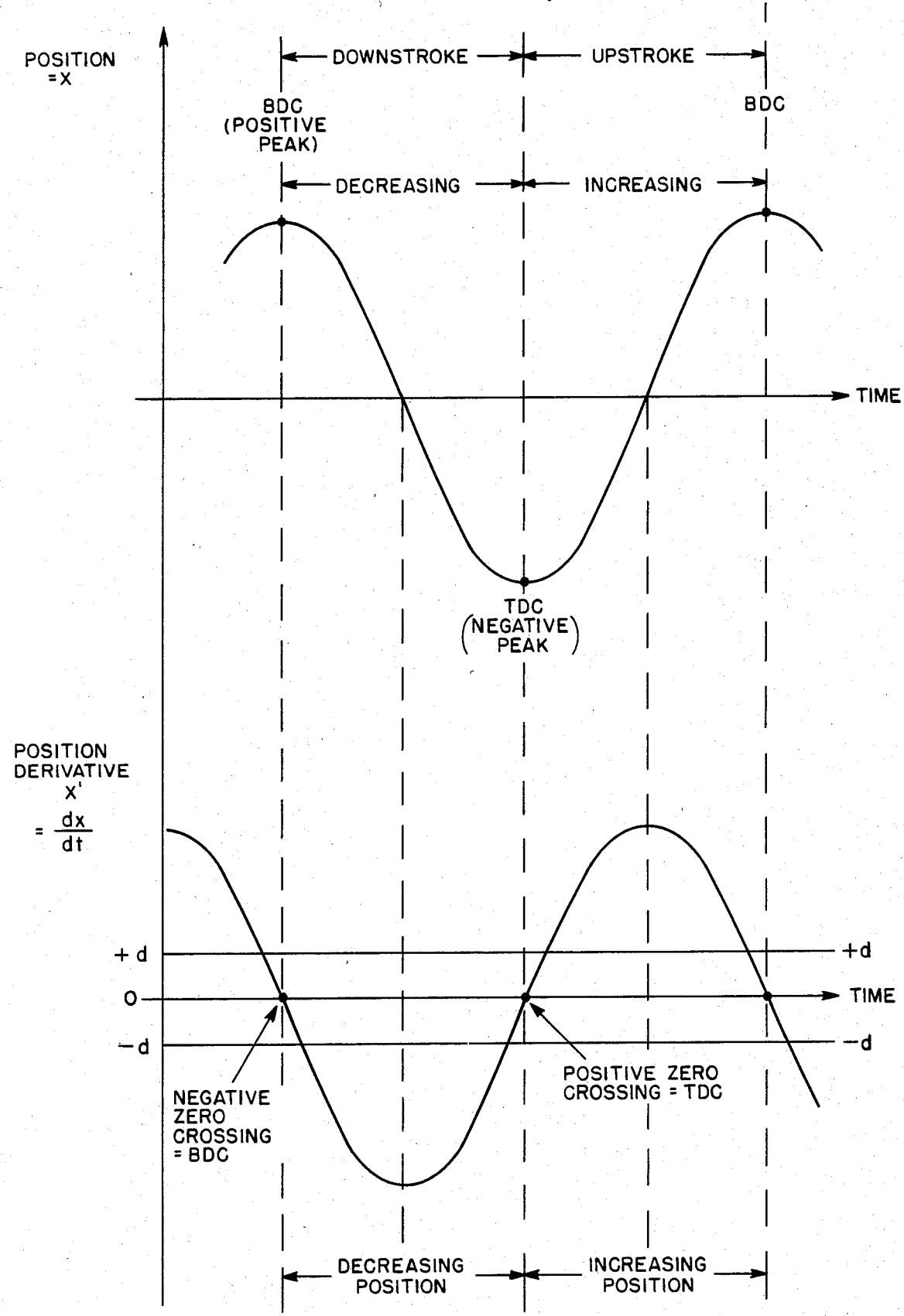

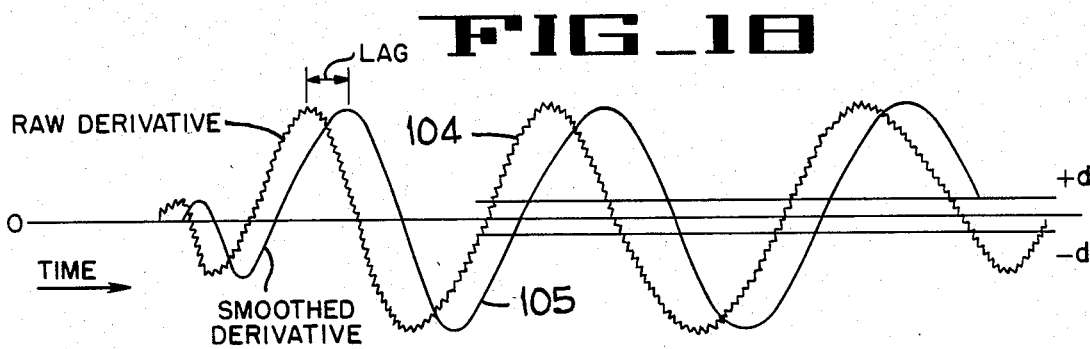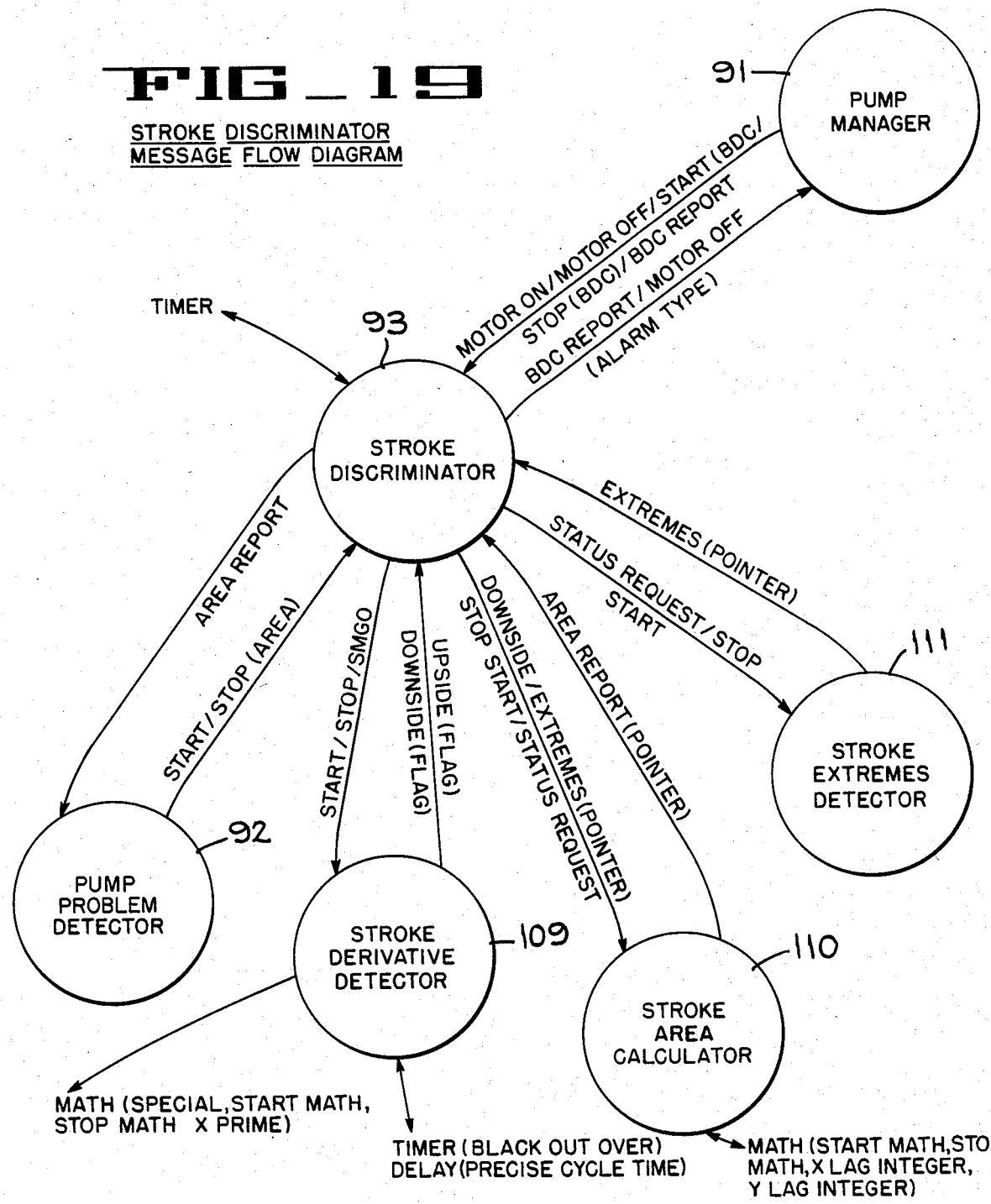

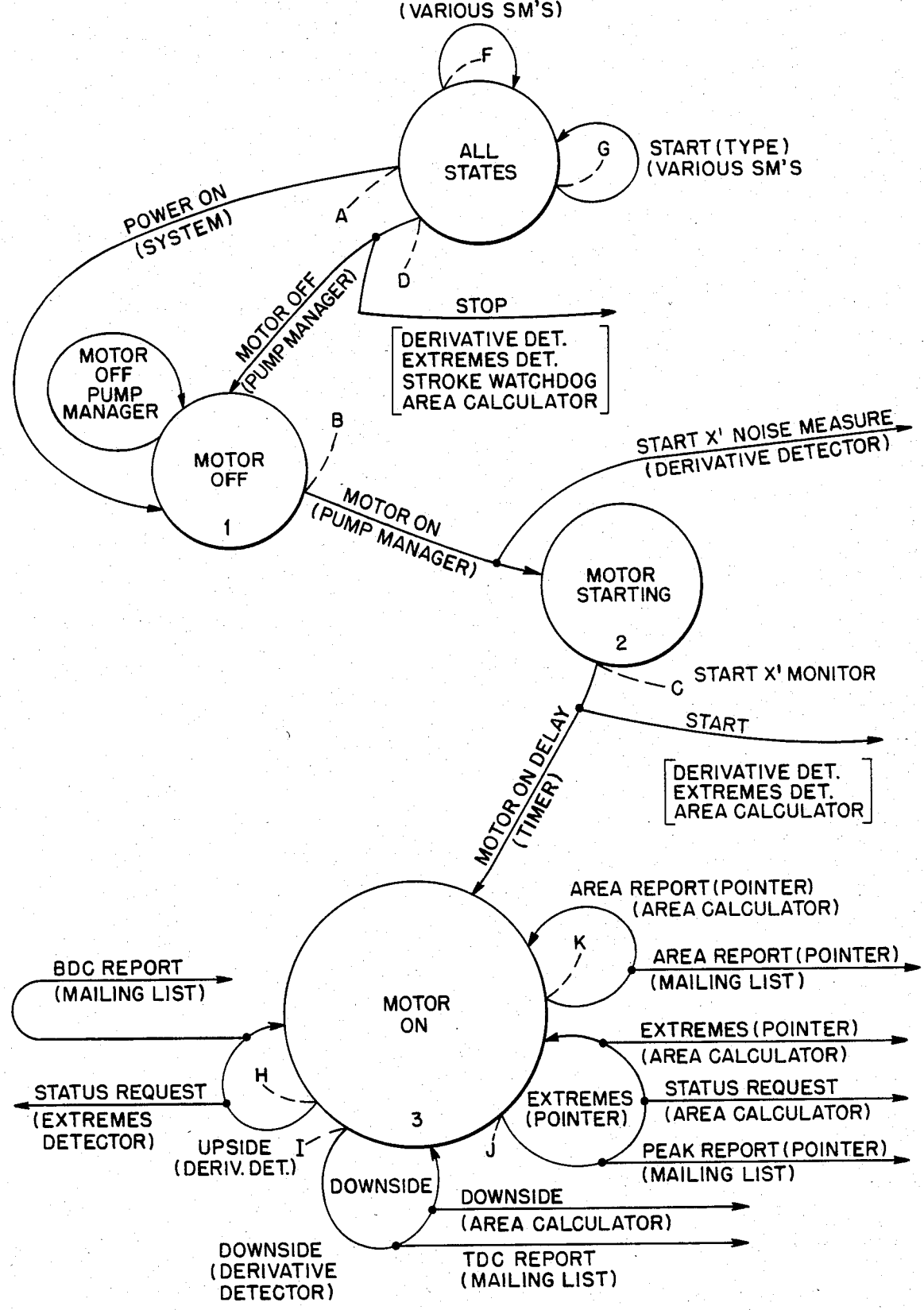

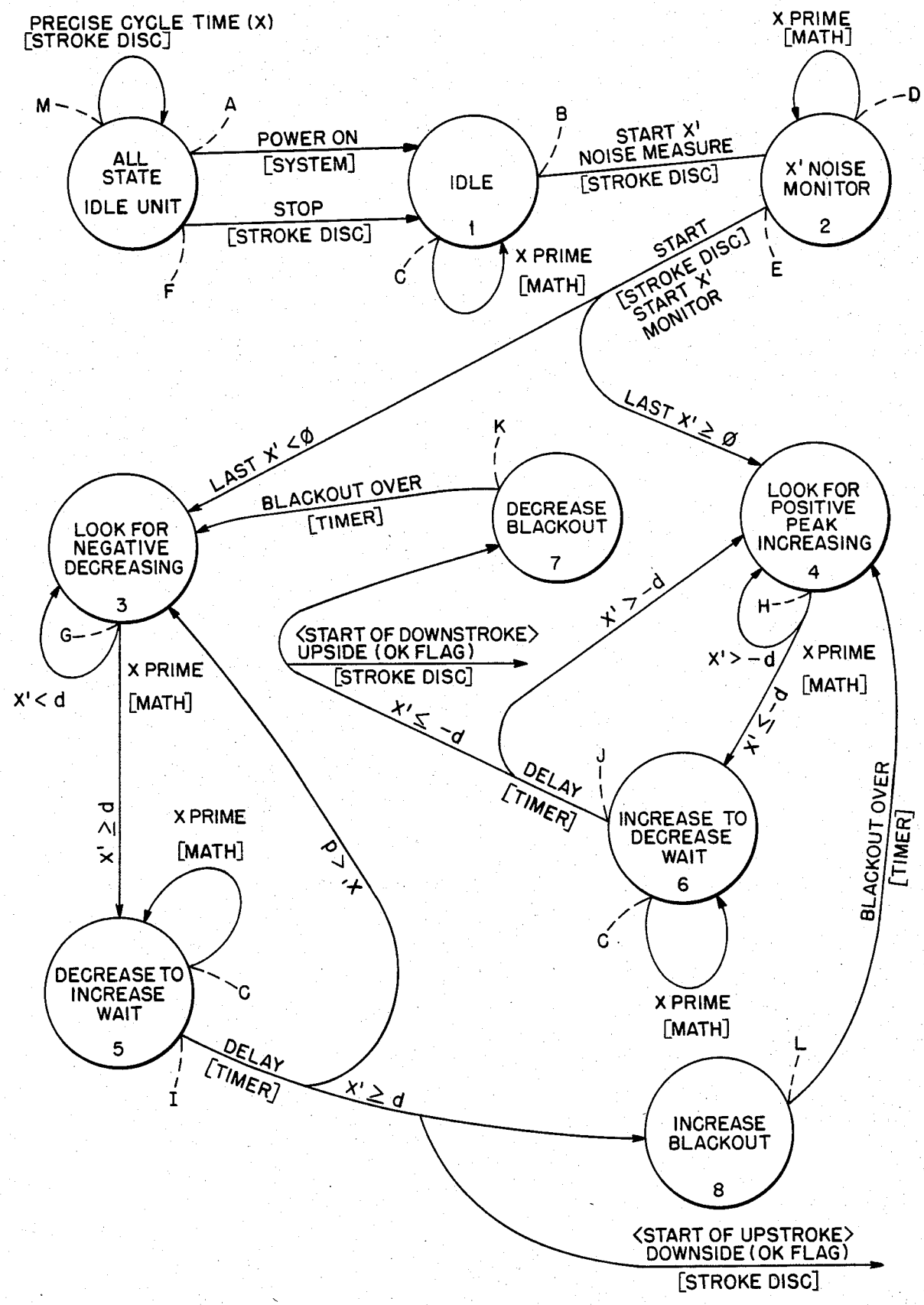

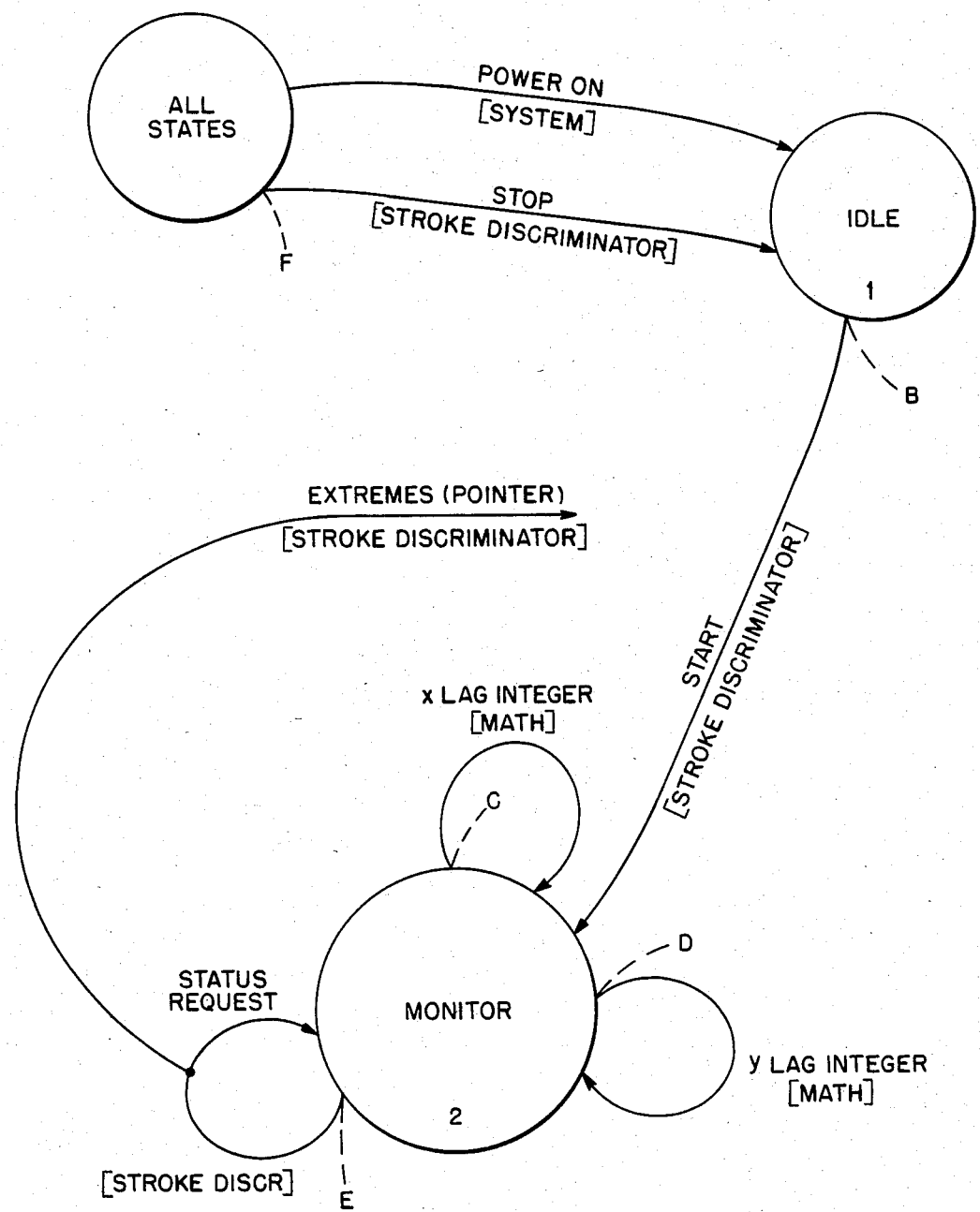
FIG_22
STROKE EXTREMES DETECTOR STATE DIAGRAM

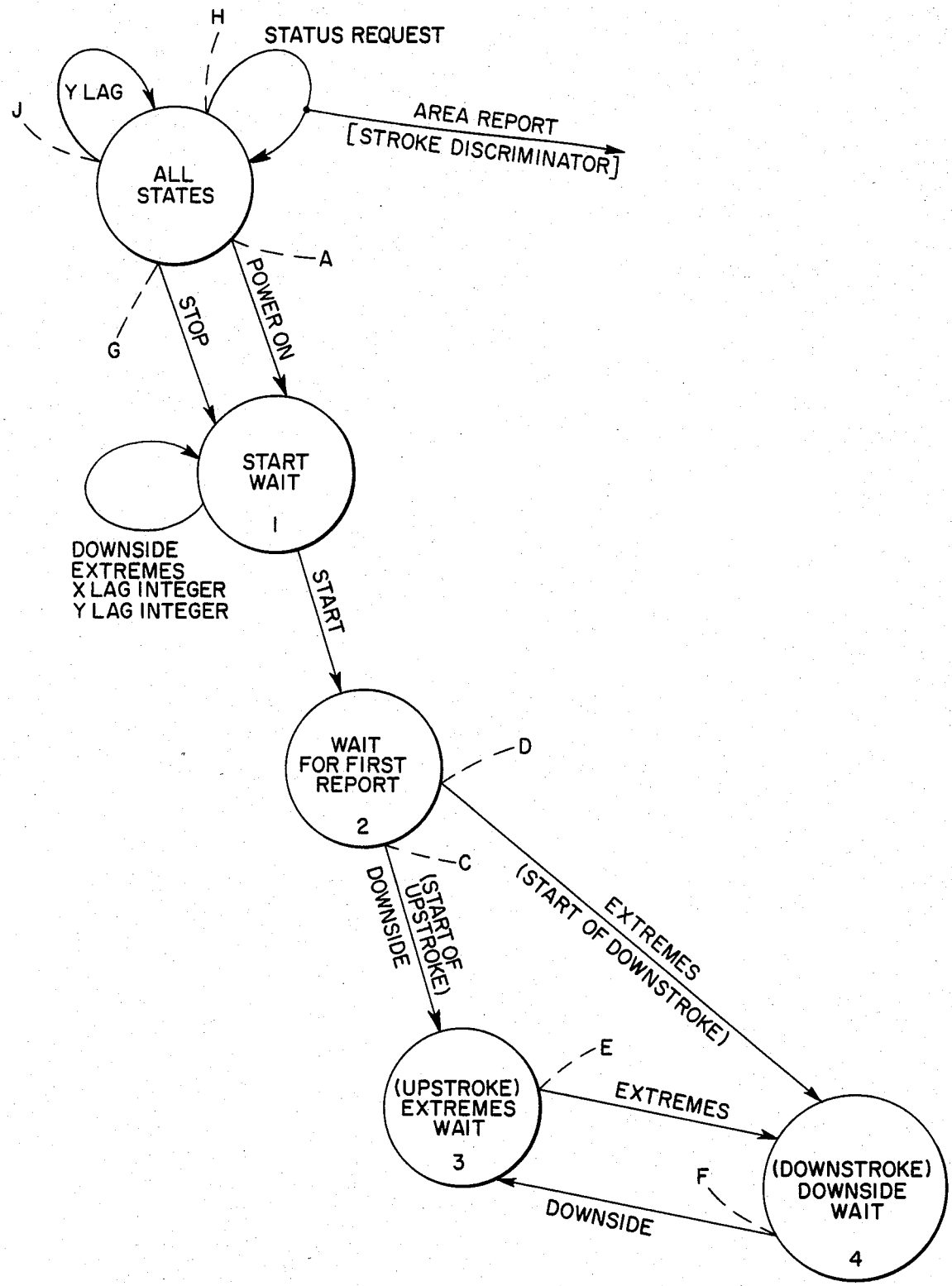
FIG_23
STROKE AREA CALCULATOR STATE DIAGRAM

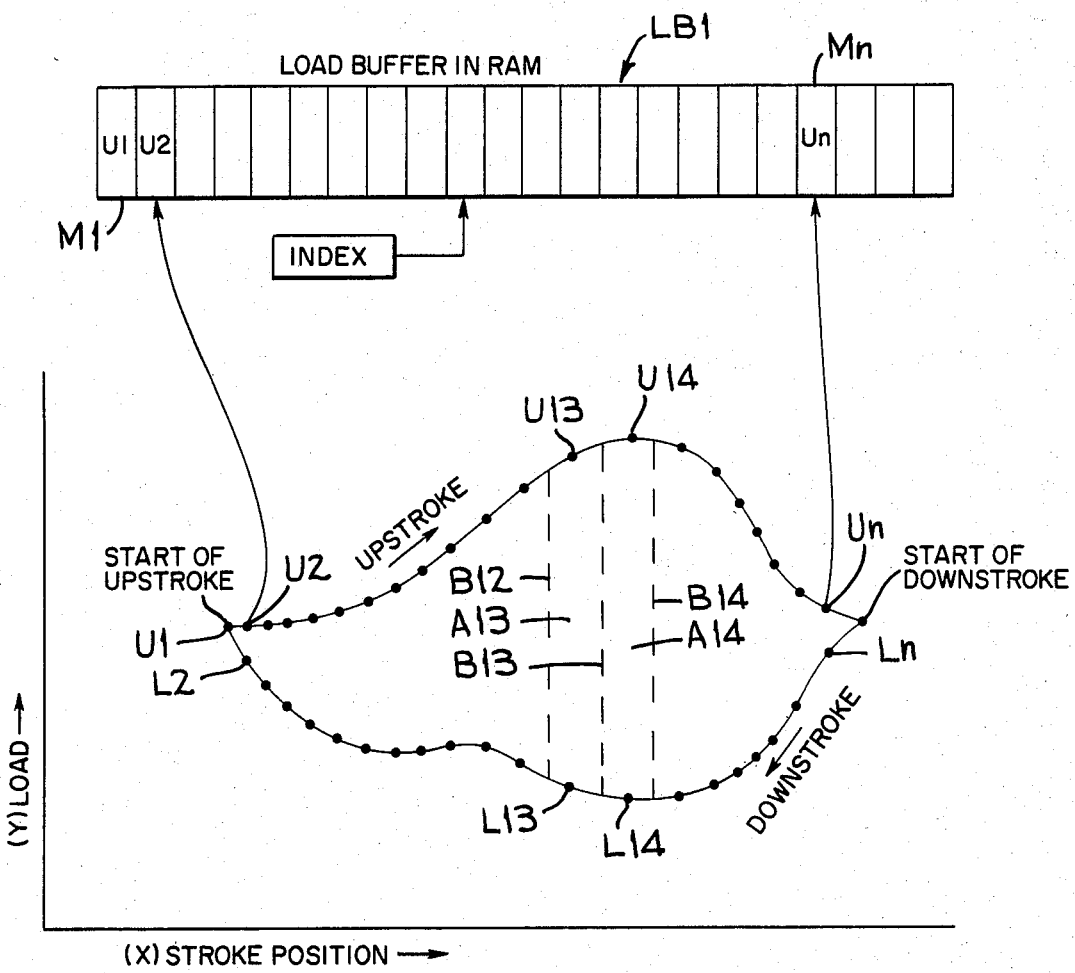
FIG_24

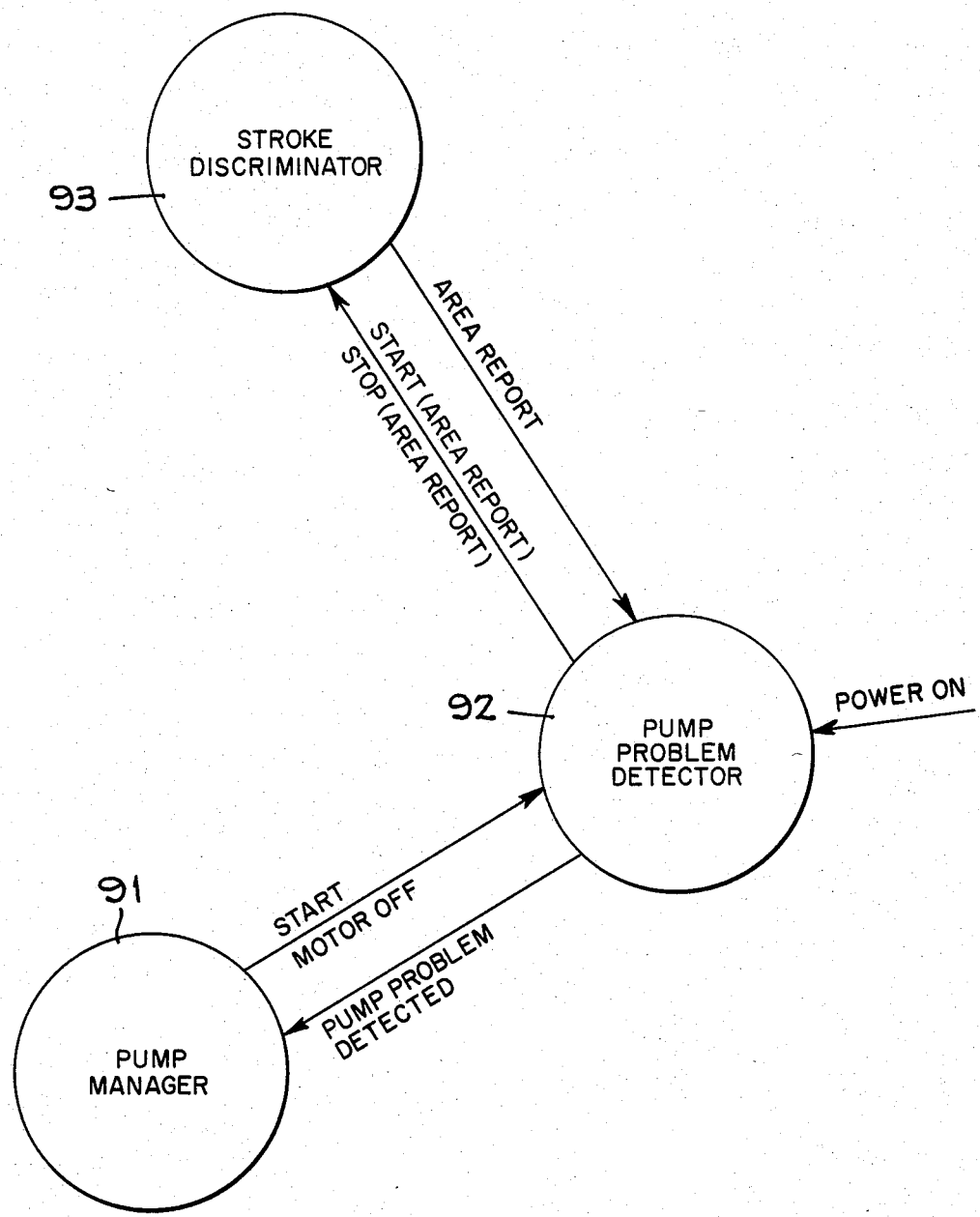
FIG_25
MESSAGE FLOW DIAGRAM PUMP PROBLEM DETECTOR

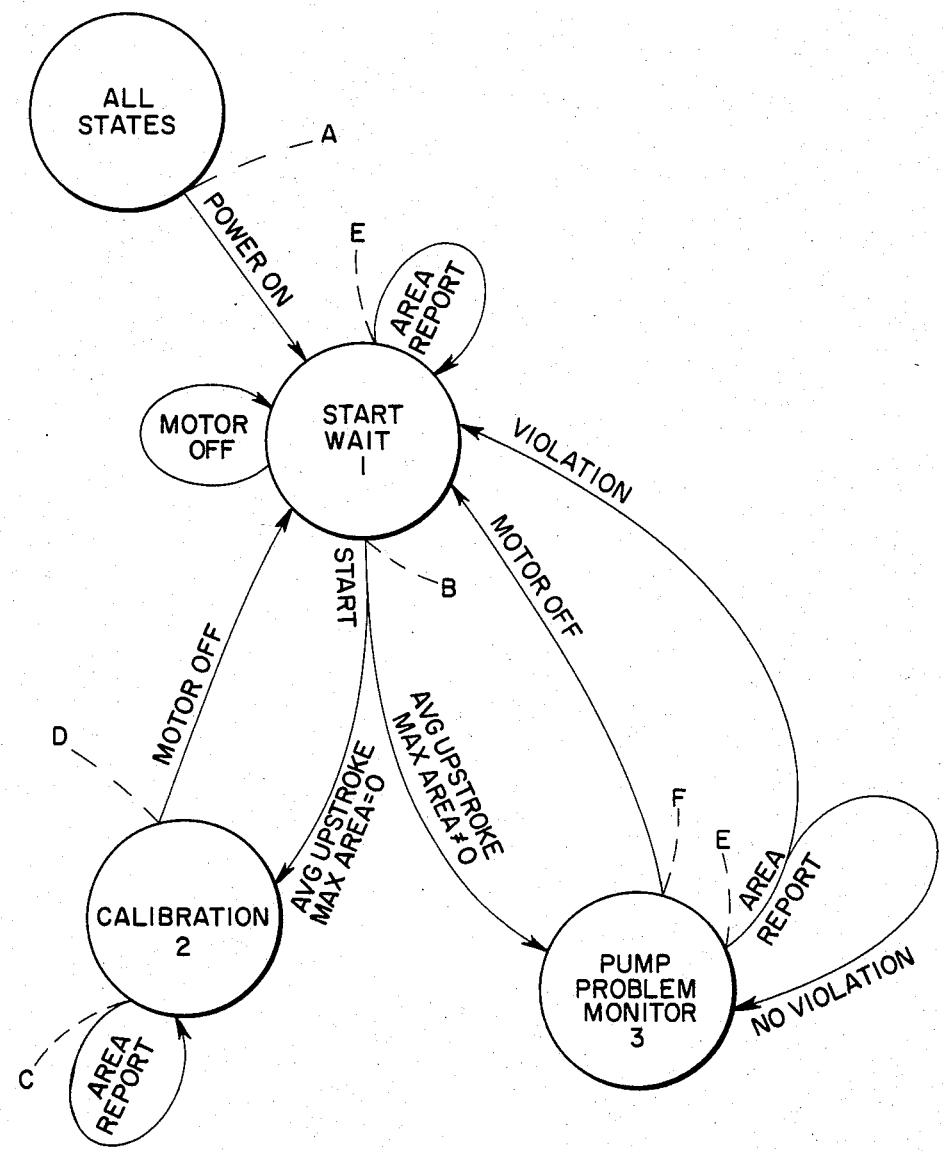
FIG_26
STATE DIAGRAM PUMP PROBLEM DETECTOR

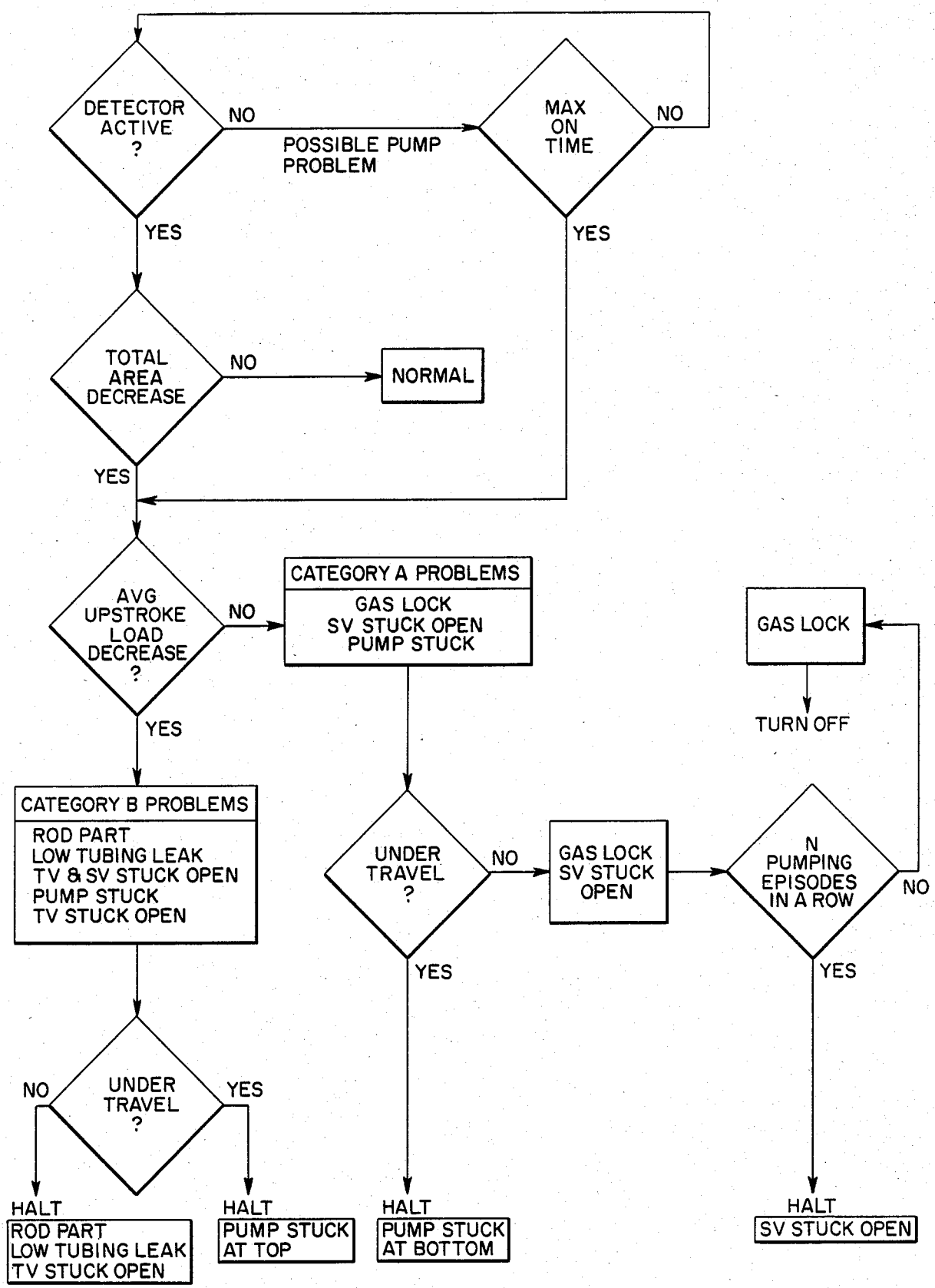
FIG_27

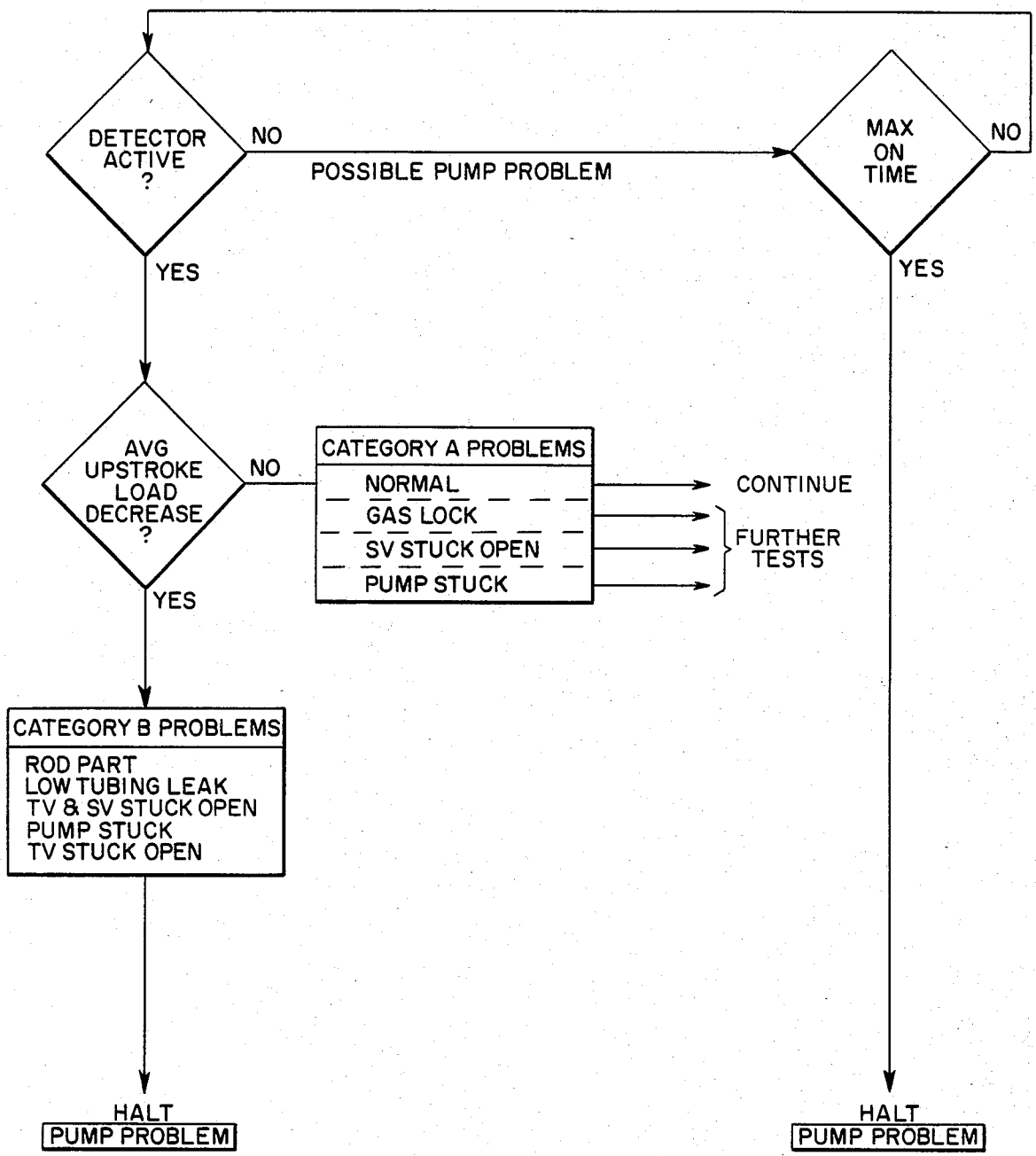
FIG_28

METHOD AND APPARATUS FOR DETECTING PROBLEMS IN SUCKER-ROD WELL PUMPS

BACKGROUND OF THE INVENTION

The present invention relates to methods and apparatus for monitoring the operation of sucker-rod well pumping units, and more particularly to methods and apparatus for detecting the breakage of a sucker-rod, and other pump problems in wells employing sucker-rod pumping units.

Sucker-rod type pumping units are widely used in the petroleum industry in order to recover fluid from wells extending into subterranean formations. Such units include a sucker-rod string which extends into the well and means at the surface for an up and down movement of the rod string in order to operate the plunger of a downhole pump. Typical of such units are the so called "beamtype" pumping units having the sucker-rod string suspended at the surface of the well from a structure consisting of a Samson post and a walking beam pivotally mounted on the Samson post. The sucker-rod string normally is connected at one end of the walking beam and the other end of the walking beam is connected to a prime mover such as a motor through a suitable crank and pitman connection. In this arrangement the walking beam and the sucker-rod string are driven in a reciprocal mode by the prime mover.

A variety of malfunctions such as worn pumps, sucker-rod part, split tubing, and stuck pump valves can interrupt the pumping of fluid from a well. Such malfunctions can be caused by normal wear and tear on the equipment, by the nature of the fluid being pumped or they could be caused by abnormal pumping conditions.

Rod part is the separation or breaking of sucker-rods in a rod pumped well due to such causes as corrosion, improper rod loading, and other types of rod damage. These failures may be either tensile failures or fatigue failures. When an applied load exceeds the tensile strength of the sucker-rod string a necked-down or reduction of the cross-sectional area can occur and the rod string will fail at the necked-down portion of the rod. This rare type of failure can occur when a pump is stuck and too much strain is placed on the rod string.

Fatigue failures occur in sucker-rod steel at applied loads less than the yield strength of the steel under cyclic load conditions. Failures can be caused by changes in fluid volume, in fluid level, by the corrosiveness of the fluid being pumped, by changes in the length or speed of the pumping stroke, or by other causes.

Mechanical damage to the sucker-rod can cause failure in either the rod joints or in the rod body. This damage can be due to the physical handling or makeup of the rod string or by motion of the rod string in the pumping cycle. The rod string is a long flexible member that should remain straight during the pumping cycle. Constant lateral or side movement of the rod string will induce stress fatigue cracks in the same manner as repeatedly bending a wire until it breaks. Bending can also cause the rod to fail due to rubbing against a casing string in the well.

The most detrimental cause of sucker-rod flexing is fluid pound. Fluid pound occurs when the well is pumped-off, i.e., when fluid is withdrawn from the well at a rate greater than the rate at which fluid enters the well from the formation. When this occurs, the working well of the downhole pump is only partially filled during an upstroke of the plunger and on the downstroke the plunger strikes or "pounds" the fluid in the working barrel causing severe jarring of the entire pumping unit. The jarring causes shock waves to travel throughout the sucker-rod string to produce flexing, overload, coupling and pin failures, and accelerates fatigue cracking from corrosion pitting and mechanical damage. Rod part can occur anywhere along the length of the sucker-rod string. When the parting occurs in the upper portion of the rod, rod part detection is relatively easy because of the change in weight of the rod connected to the walking beam, but deep well parting is difficult to detect because there may be relatively little change in rod weight.

The downhole pump includes a standing valve located at the lower end of the pump to allow fluid to move into the pump, and a plunger which moves up and down to move the fluid to the top of the well. A traveling valve located on the plunger allows fluid to move above the plunger on the downstroke of the plunger and allows the plunger to lift fluid toward the top of the well on the upstroke. If either of the valves should become stuck open or if the plunger should become stuck to the sidewalls of the pump upward fluid flow will stop and damage could quickly result to other portions of the pumping system.

SUMMARY OF THE INVENTION

The present invention provides new and improved methods and apparatus for detecting rod part and other pump problems in a well pumping unit having a sucker-rod string and a power unit to reciprocate the rod string to produce fluid from a well. A load cell is connected between the sucker-rod string and the power unit to develop a signal representative of the load on the rod string, and a transducer is connected to generate a signal representative of the position of the rod string. A dynacard of sucker-rod position vs. sucker-rod load for a properly operating well is obtained and compared with dynacards which are plotted during well production. Most of the pump problems cause a significant change in the area of the dynacard and/or a change in the level of the load on the rod string and on the load cell. If a pump problem should occur, a computer is used to compare the characteristics of the production dynacard with the characteristics of the normal dynacard and determine which general type of problem caused the abnormal dynacard characteristics. A computer program causes the computer to check any abnormal dynacard areas and abnormal load levels against dynacard areas and load levels caused by known pump problems and determine which of these problems are present in the pumping system. When abnormal areas and/or load levels occur, the computer automatically disables the pump motor and provides a signal which tells a human operator which type of pumping system fault caused the motor shutdown.

BRIEF DESCRIPTION OF THE DRAWINGS

FIG. 1 is a diagrammatic illustration of a well equipped with a sucker-rod type pumping unit.

FIG. 2 is a plot of the position vs. load of the sucker-rod of the pump for one cycle of normal operation.

FIGS. 3–7 are plots of position vs. load of the sucker-rod of the pump for different types of pump problems.

FIG. 8 is an enlarged cross-sectional view of the downhole pump shown in FIG. 1.

FIG. 9 illustrates the relationships between the various load signal levels used in differentiating between several types of pump problems.

FIGS. 10A, 10B comprise computer circuitry which can be used in the apparatus of FIG. 1.

FIG. 11 is a matrix diagram illustrating the operation of software state machines used in the present invention.

FIG. 12 is a diagram illustrating symbology of a typical software state machine used in the present invention.

FIG. 13 illustrates a message switched software operating system of the present invention.

FIG. 14 illustrates a software state machine scheduler of the present invention.

FIGS. 15 and 16 illustrate the flow of data through the operating system and math utility of the present invention.

FIG. 17 illustrates typical position and position derivative waveforms in the apparatus of the present invention.

FIG. 18 illustrates the relationship between smoothed (filtered) data signals and noisy (unfiltered) signals and shows signal phase shifts which may be considered in the apparatus of the present invention.

FIG. 19 is a message flow diagram of a stroke discriminator of the present invention.

FIG. 20 is a software state diagram of the stroke discriminator of the present invention.

FIG. 21 is a software state diagram of a stroke derivative detector of the present invention.

FIG. 22 is a software state diagram of a stroke extremes detector of the present invention.

FIG. 23 is a software state diagram of a stroke area calculator of the present invention.

FIG. 24 illustrates a procedure used in calculating the area inside a dynagraph curve for a typical well.

FIG. 25 is a message flow diagram showing the mode of operation of the apparatus of FIG. 1.

FIG. 26 is a state diagram of a pump problem detector of FIG. 25 used to detect downhole pump problems.

FIGS. 27 and 28 are flow diagrams showing the procedure for determining the type of pump problems which develop in a well.

DESCRIPTION OF THE PREFERRED EMBODIMENT

Referring to FIG. 1, there is illustrated a wellhead 10 of a well which extends from the earth's surface 11 into a subsurface well producing formation (not shown). The wellhead comprises the upper portions of a casing string 12 with a sucker-rod string 15 extending downward into a downhole pump 16 which moves liquid to the surface where it passes into a flow line 17. The sucker-rod string 15 is suspended in the well from a support unit consisting of a support post 18 and a walking beam 22 which is pivotally mounted on the support post by a pin connection 23. A load cell 24 is connected between the upper end of the sucker-rod string 15 and the lower end of a cable section 28. The cable section 28 is connected to the walking beam 22 by means of a horsehead 29.

The walking beam 22 is reciprocated by a prime mover such as an electric motor 30. The prime mover drives the walking beam through a drive system which includes a drive belt 34, crank 35, crank shaft 36, crank arm 37, and a pitman 41 which is pivotally connected between the crank arm and the walking beam by means of pin connections 42, 43. The outer end of the crank arm 37 is provided with a counterweight 44 which balances a portion of the load on the sucker-rod string in order to provide a more constant load on the prime mover. The lower end of the sucker-rod string 15 is connected to the downhole pump 16 which may be located from several hundred to several thousand feet below the earth's surface 11.

The downhole pump 16 (FIGS. 1, 8) includes a cylindrical working barrel WB secured in position inside the casing string 12 by seating cups (not shown) or by other means well known in the art. A plunger P having a traveling valve TV therein is moved up and down in the working barrel WB by the sucker-rod string 15 to move fluid upward in the tubing 12 on the upward stroke of the plunger. A standing valve SV at the lower end of the working barrel WB allows fluid to flow into a chamber C as the plunger P moves upward and retains fluid in the chamber C as the plunger P moves downward. The traveling valve TV opens as the plunger moves downward to allow fluid to move above the plunger and the valve TV closes as the plunger is raised so fluid is forced upward in the tubing 12.

The load cell 24 provides a DC output signal which is proportional to the load on the sucker-rod string 15, and an analog-to-digital converter 48a provides a corresponding digital signal to a computer 49a. A position measuring means or transducer 53 includes an actuating arm 54 for measuring the vertical position of the sucker-rod string 16 by providing a voltage which is proportional to the angle of the walking beam 22 and thus is proportional to the position of the rod string 16. The analog-to-digital converter 48a also converts the signal from the transducer 53 into a digital signal which is used by the computer 49a. Signals are transferred from the computer 49a to a computer 49b by a pair of universal synchronous asynchronous receiver transmitters (USARTs) 55a, 55b for controlling the operation of an XY plotter 59. Instructions from a keyboard and display unit 60 and output signals from the load cell 24 are used by the XY plotter to provide a visual plot of the characteristics of the particular well which the rod string operates. The plotter 59 can be used for observing operation of the well and for setting up the equipment to monitor the well. After setup is completed the plotter can be disconnected, or if desired the plotter can be eliminated altogether and other means for setting up the equipment can be used. Analog signals from the XY plotter 59 are converted into digital signals by an analog-to-digital converter 48b for use by the computer 49b and digital signals from the computer 49b are converted into analog signals by a digital-to-analog converter 61 for use by the plotter. The keyboard 60 allows a human operator to enter various values and instructions into the computer 49b.

A plot of the position versus load of the rod string 15 (dynagraph) for a typical cycle of the rod string when the well is filled with fluid is disclosed in FIG. 2. It can be seen that as the upper end of the rod string moves on the upstroke from the Xmin position to the Xmax position, the load on the load cell 24 increases to a maximum value PPRL and then returns to approximately the initial value. This gradual change in load on the cell 24 (FIG. 1) is caused in part by the change in length of the rod string 15 and by the gradual change in vertical velocity of the load cell 24 and the upper end of the rod string 15. The metal rod string may be several thousand feet long and stretches some distance when an upward motion is supplied to the load cell 24 with a load, such as a long column of fluid, on the plunger P (FIGS. 1, 8).

As a result when the plunger (FIG. 8) is at the bottom of the pump 16, the load cell 24 and the upper end of the rod string 15 move upward a short distance before the plunger P starts its upward motion to provide a significant delay in the increase of load on the load cell 24. The load cell 24 and the plunger P gradually increase their vertical velocity and a "peak polished rod load" PPRL (FIG. 2) is reached as the load is pulled upward by the cable section 28. As the load cell 24 reaches its topmost position the load on the cell is approximately the same as at the start of the upstroke.

When the load cell 24 (FIG. 2) starts the downstroke the traveling value opens which removes the load from the rod string so the load on the cell decreases rapidly as the cell gains downward velocity and then returns to a value approximately the same as the load at the start of the upstroke. This shape of dynagraph will not be obtained when a pump problem exists in the well. Most of the pump problems cause a significant decrease in the area inside the dynagraph.

When the sucker-rod parts in the upper portion of the rod, the area of the dynagraph decreases and the upstroke load on the load cell 24 (FIG. 1) decreases to produce the dynagraph of FIG. 3 with the minimum load usually below the MPRL value of FIG. 2. These changes are due to the absence of fluid load and a decrease in rod weight on the load cell as the load cell 24 moves upward. When the rod part occurs near the downhole pump 16, the dynagraph of FIG. 3 will be higher due to the greater weight of the long sections of sucker-rod 15. A similar dynagraph (FIG. 3) will be produced if the traveling valve TV (FIG. 8) is stuck open, or if there is a leak in the lower portion of the casing string 12 or if the traveling valve TV and the standing valve SV are both stuck open.

When the plunger P (FIGS. 1, 8) is stuck, the load on the load cell 24 increases so the dynagraph will be above the normal load position and appear generally as shown in FIG. 4.

A flowing well provides a dynagraph as shown in FIG. 5 and a gas (vapor) locked pump provides the dynagraph shown in FIG. 6. When a pump becomes worn so fluid is no longer lifted by the plunger P (FIG. 8) the dynagraph is as shown in FIG. 7.

The computer 49a (FIG. 1) continually monitors the area of the dynagraph and the maximum and minimum values of the load to detect any pump problems which may develop. The computer shuts down the well when a serious problem is detected and provides information which informs a human operator what type of problem caused the well to be shut down.

Details of a method and apparatus for monitoring pump operation are disclosed in FIGS. 10A, 10B, and 25-28. When FIGS. 10A, 10B are placed side-by-side with leads from the right side of sheet 10A extending to corresponding leads from the left side of sheet 10B the two sheets comprise a block diagram of an embodiment of the computers 49a, 49b (FIG. 1).

The portion of the computer system disclosed in FIG. 10A comprises a motor controller 71 for receiving signals from the load cell 24 and from transducer 53 and for using these signals to determine the sequence for controlling the motor 30. The computer 49b disclosed in FIG. 10B comprises a plotter controller 72 for using the load cell and transducer signals transmitted from computer 49a to operate the XY plotter 59. Signals are interchanged between the motor controller 71 and the plotter controller 72 over the pair of interconnecting wires 66, 67.

Each of the controllers 71, 72 includes a central processor 73a, 73b, a programmable interrupt controller 74a, 74b, a programmable peripheral interface 75a, 75b and a memory decoder 76a, 76b connected for the interchange of information and instructions over a system bus 80a, 80b. A central processor 73a, 73b which can be used in the present invention is the model 8088 manufactured by Intel Corporation, Santa Clara, Calif. A programmable peripheral interface 75a, 75b which can be used is the model 8255A and a programmable interrupt controller 74a, 74b which can be used is the model 8259A both manufactured by Intel Corporation. An input/output decoder 77a, 77b decodes address signals for selectively enabling the peripheral interfaces 75a, 75b to send and receive information from the system bus 80a, 80b.

Clock pulses for driving the central processors 73a, 73b are provided by a pair of clock drivers 81a, 81b which are initialized by a pair of "power on reset" generators 82a, 82b. The generator 82a also includes a power fail circuit to warn that power to the controller is failing. A clock driver 81a, 81b which can be used in the present invention is the model 8284A *manufactured by Intel Corporation. A pair of indicating devices 83a, 83b* provide visual display of information from the peripheral interfaces 75a, 75b. The indicating device 83a also includes a plurality of switches for entering information into the motor controller. A pair of timers 84a, 84b provide timing signals to operate the controllers 74a, 74b and information is transferred between the motor controller 71 and the plotter controller 72 by the pair of universal synchronous asynchronous receiver transmitters (USARTs) 55a, 55b. One such USART which can be used in the present invention is the model 8251A manufactured by Intel Corporation. Programs for operating the motor controller 71 and the plotter controller 72 are stored in a PROM 86a, 86b and data for use in the system is stored in a RAM 87a, 87b. Data to be retained during a power failure can be stored in a nonvolatile RAM 85. One such RAM which can be used in the present invention is the model IXD2212 manufactured by XICOR, Inc., Milpitas, Calif. A load/stroke conditioner 88 (FIG. 10A) amplifies and filters signals transmitted from the load cell 24 and the transducer 53 and sends the smoothed signals to the bus 80a through a multiplexer 89a and the analog-to-digital converter 48a. A pair of digital-to-analog converters 61a, 61b (FIG. 10B) provide analog signals to operate the XY plotter 59 in response to digital signals on the system bus 80b. A multiplexer 89b and the analog-to-digital converter 48b provide digital signals which correspond to the X and Y positions of the plotter 59. An analog-to-digital converter which can be used is the model AD574A manufactured by Analog Devices.

The general operation of a method for detecting pump problems using apparatus of the present invention has been described in connection with FIGS. 1–8. A detailed description of the method of using the motor controller 71 and the plotter controller 72 to determine when the well has a pump problem will be described in connection with FIGS. 11–28 which provide background of the use of software state machines and of their use in operating the apparatus of FIGS. 1, 10A and 10B and provides details of the operation of a computer program in carrying out various operations performed by the computer of FIGS. 10A, 10B.

The program of the present computer is supported by a real time operating system having various routines that are not applications oriented and that are designed specifically to support programs designed with the state machine concept, that is, a state, input driven program. Some of the routines are sub-routines while others form a module that creates a simple real-time environment under which software state machines can operate. The operating system provides equipment in which a collection of software state machines can operate.

A software state machine is a process that is executed on the digital computer each time that a message is sent to the state machine. The process does not execute in exactly the same way each time that a like message is sent to it because the processing to be done for any message depends on the machine's "state", i.e., its memory of all prior processing that it has done in response to the previous messages. The state can be any length, from eight binary digits to several thousand binary digits depending upon the complexity of a given machine. Given the state of the machine and the current message, the machine will do a given set of processing which is totally predictable. A machine can be represented as a matrix of processes, indexed by a state and a message as shown in FIG. 11. For example, if the state machine of FIG. 11 receives message number one in state one, then process A will be done. If process A were to cause the state to be changed to state two then a second message number one, coming right after the first message would cause process D to occur which could cause the machine to change to state three. It is not necessary that a process cause the state to change, although it may do so in many cases.

A software state machine, upon completing its process defined by the state and by the message returns control to the program that called it, the state machine scheduler which will be described below. During the given process, the machine is not interrupted in order to give processing time to another machine of the same system. Thus, processing time appointment between a given machine and any of its contemporaries in the system is on a message-by-message basis, and such an environment is called a message switched operating system (MSOOS). None of the machine's processes are ever suspended for the processes of another machine. For example, if message three comes in state one, process C will begin and end before another state machine can have the central processing unit (CPU) 73a (FIG. 10A) to respond to its next message in its given state.

Certain things can cause a state machine process to "suspend". For example, an asynchronous interrupt can be registered and processed. A requirement of the operating environment is that such hardware events are turned into software messages to be processed in order by the responsible state machine. Only that processing that must be done at the exact instant of the interrupt is done and then the interrupt service process will cause a software flag to be raised, ending the interrupt process. When the operating system notes an asynchronous flag (semaphore), it generates the needed software message to be sent to the state machine that will carry out the non-time-critical segment of the interrupt processing. An example of such a process is data collection at precisely timed intervals. When the timer interrupt signals that data must be collected, it is read in the required manner dependent on the type of the data, queued in a storage area for processing at a later time, and a flag is raised. When this raised flag is noted by the operating system, a software message is generated, the data is stored and the state machine that is responsible for the processing of this data receives the message at a later time.

A state machine is not given access to the processor by the operating system on a regularly timed basis but is connected to the processor only in order for it to process a message. Whenever the processing of a message is completed the state machine must insure that it will get another message at some point in the future. This is done in the following ways:

(1) Another machine sends a message for synchronizing purposes.

(2) A time period elapses signaled by a timer message.

(3) Real-time data becomes available from some queue.

(4) An input which is being polled, achieves the desired state, and initiates the software message.

(5) An interrupt is sensed and a software message is sent to inform the state machine about this event.

The only time that a machine cannot take care of itself is prior to receiving its first message, so the operating system takes the responsibility of initiating the system by sending to all of the software state machines, functioning therein, an initializing message referred to herein as a "power on" message. No matter what the state of the machine it will respond with a predetermined given process when this message is received independent of the state of the machine.

A convenient means of illustrating the operation of a software state machine is shown in the state machine symbology of FIG. 12 using the messages of FIG. 11 to do some of the processes and to move into some of the states shown in FIG. 11. If we assume the machine (FIG. 12) to be initially in state one, the receipt of message one causes process A to be performed as the transition action for message one received in state one and also causes the machine to move into state two. In state two the receipt of message two causes process E, causes a message to be sent out to another state machine and moves this state machine back into state one. In state one the receipt of message three causes process C as the transition action for receiving message three in state one but does not cause any change in the state of the machine. Some of the other states and processes shown in FIG. 11 are not repeated in FIG. 12 in order to simplify the drawing.

A message switched operating system of the type shown in FIG. 13 includes a main procedure which provides signals to initialize the system through a system initializing procedure and includes the initialization of various interrupts, timers, the scheduler, inputs, data acquisition, the nonvolatile RAMS, the math utility and outputs as well as initializing the available message blocks so that all dynamic memory is put into an available space queue for storing data. The procedure then calls the duty cycle procedure which sequentially calls the asynchronous processing, state machine scheduler and synchronous processing over and over again. All interrupt programs communicate with the duty cycle program by way of semaphores. The duty cycle program runs indefinitely with a state machine message delivery, an asynchronous operation and all synchronous operations timed by the real-time clock for each cycle of the loop. Asynchronous operations that can occur are: data input from a real-time data acquisition queue and communication line interrupts to move characters in and out of the system. In the asynchronous operation significant events occurring cause an available message block to be secured and turned into a message to be delivered to whatever state machine is charged with processing the particular interrupt. Since the data is queued at the time of acquisition, the transfer operation is asynchronous. If the data processing falls behind the data input, the system can use the time between synchronous clock ticks to catch up on the required operations. Details of the data flow in the asynchronous processing of the DQ block of FIG. 13 are shown in FIG. 15. Signals from the load cell 24 and the stroke transducer 53 (FIG. 15) are acquired by the GET XY data procedure and are transferred into the XY data queue in RAM 87a (FIG. 10A) by the PUT XY Q procedure in response to a real-time clock interrupt and are removed by the GET XY Q procedure.

Once the data has been acquired it is processed by the math utility (at PM, FIG. 13). The math utility accesses the raw values of stroke (X) and load (Y) and smoothes the values of X and Y. The smoothed value of X ($\overline{X}$) (FIG. 16) and the smoothed value of Y ($\overline{Y}$) are obtained by using a moving average smoothing technique where the last n values of X (or Y) received are added and divided by the number of values (n) to obtain a first smoothed value. To obtain the next smoothed value, $\overline{X}$, the newest value is included in the sum, but the oldest received value of the last n values is not included.

The first derivative, $\overline{X}'$ is then computed and $\overline{X}$ is corrected for the time lag introduced by the computation of the first derivative to obtain the result $\overline{X}$lag. The values of $\overline{X}'$, $\overline{X}$lag, $\overline{Y}'$ and $\overline{Y}$lag are then sent to all state machines that have signed up for these values using the "send message" procedure (FIG. 14) to place these messages on the queue of messages to be delivered.

The first derivative is computed using a method developed by A. Savitzky and M. Golay and described in detail on pages 1627–1638 of the July 1964 issue of "Analytical Chemistry" magazine. This method uses a least squares quadratic polynomial fit of an odd number of points and a corresponding set of convolution integers to evaluate the central point. The derivative computed corresponds to the value at the midpoint of a window of equally spaced observations. The value obtained is identical to the best fit of the observed values to the quadratic polynominal $A_2X^2 + A_1X + A_0 = Y$. $A_2$, $A_1$, and $A_0$ are selected such that when each X (for the number of points in the window) is substituted into this equation, the square of the differences between the computed values, y, and the observed number is a minimum for the total number of observations (window size). Once $A_2$, $A_1$ and $A_0$ are found the central point is evaluated.

Since the derivative is evaluated at the center of the set of data a lag equal to the (window size $-1$) divided by 2 is introduced. Details of the math utility for obtaining values of $\overline{X}'$, $\overline{X}$lag, $\overline{Y}'$ and $\overline{Y}$lag are shown in FIG. 16.

The synchronous processing performs hardware input polling, timer aging and signal delivery. When an input, requested for polling by any state machine via a procedure call, gets to the desired state such as an off condition, an on condition, above a level or below a level, etc. an available message block is sent as a message to the requesting machine indicating that a given input is in the desired state. The input will no longer be polled until another request is made.

The timer process is slightly different in that the timer queue is made up of message blocks serving as receptacles for the machine requesting the marking of the passage of time and the time of day when the time will be completed. When the time is completed the block is removed from the timer queue and placed on the message delivery queue as a message. Thus, all responsibilities placed on the state machine are accomplished in the operating system by transferring software messages and by the use of real-time flags and queues (semaphores).

The first component of the operating system (FIG. 13) is a program to deliver a message to a state machine (FIGS. 13, 14). A message is a small block of dynamic memory that is queued for delivery to a designated state machine. This program is called a state machine scheduler and shown in detail in FIG. 14 selects the next highest priority message from the queues of messages ready for delivery. The machine looks up the designation state machine code stored in the message and uses that code to select the proper state machine program to be called with a pointer to the message block as an input. Contained in the program is a state memory. With the message and the state the proper process can be delivered and executed, and the memory block transferred from the deliver queue to the available space queue for subsequent reuse. Two examples of data that is reused are instructions for sending the messages or setting timers. These processes take available blocks and turn them into messages that will be on the message delivery queue at some later time. Programs such as the message sender and the timer starter are service utilities called by the state machine in order to fulfill the responsibilities alluded to earlier. The state machine schedular program is the lowest of the hierarchy which forms the main duty cycle of the operating system. In the diagram of FIG. 13 the relationship of the scheduler to the rest of the operating system is shown.

When power is turned on in the computer of FIGS. 10A, 10B, the power on reset generators 82a, 82b provides signals which reset various hardware in the computer and cause the first instruction of the computer program stored in the PROM 86a to be executed by the central processor 73a. A "power on" message is sent, in the manner previously described, to each of the state machine modules 91–93 (FIG. 25) in the computer and these state machine modules are initialized. The load signal values from the load cell 24 (FIG. 10A) and the stroke signal values from the transducer 53 are obtained by the processor 73a through conditioner 88 and converter 48a and stored in the RAM 87a (FIGS. 10A, 15) for use by the stroke discriminator which uses these signals to detect maximum and minimum values of load and rod position. The maximum and minimum values of load and rod position are available to other state machine modules upon request.

The stroke discriminator 93 (FIG. 25) provides area reports to the pump problem detector 92. Details of the stroke discriminator 93 (FIG. 25) and its method of operation are disclosed in FIGS. 17–24 where curve 104 (FIG. 18) shows a typical raw derivative of the rod string 16 (FIG. 1) position vs. time, and curve 105 shows the smoothed derivative of the same. An average of several values of the raw derivative from a timed sequence of values are used in obtaining the smoothed derivative thereby causing a lag between the phase of the smoothed derivative and the raw derivative as shown in FIG. 18. The lagged smoothed derivative is used by a stroke derivative detector 109 (FIG. 19) to obtain the maximum and minimum in the stroke value. Once the maximum and minimum values are obtained the system stops looking for another extreme value for a predetermined "blackout time" to reduce the average real processing time consumption by the stroke derivative detector. The blackout time also makes the stroke system more immune to noise in the data input from the stroke transducer 53 (FIG. 1).

There are several software messages that are incoming to the stroke discriminator from the pump problem detection system and from other machines that are not neighbors in the state machine hierarchy. These messages include a "power on" message common to all machines, start and stop messages from other machines which ask for a report of the stroke low point, note of the stroke high point, peak reports of X and Y (stroke and load extremes), and area reports. The Xlag, Ylag and X derivative messages are received from the math utility.

The stroke discriminator 93 (FIG. 19) communicates directly with the pump manager 91 and with the subservient stroke derivative detector 109, a stroke area calculator 110 and a stroke extremes detector 111. The stroke extremes detector 11 uses the raw values of signal from the load cell 24 (FIG. 1) and the position transducer 53 to find the Xmax, Xmin, Ymax and Ymin. The area calculator 110 integrates the area of the dynagraph (FIG. 2), and the stroke discriminator 93 directs the operation of the other state machines 109–111 shown in FIG. 19.

After the pump manager 91 (FIG. 19) turns on the motor 30 (FIG. 1) a motor on message and a start BDC (bottom dead center) report message (i.e., a signup for start of downstroke report) (FIG. 19) are sent to the stroke discriminator 93. The stroke discriminator waits 3 seconds to allow the stroke signal noise to be measured and sends a start message to the state machines 109–111 to monitor the well operation. If a pump problem is detected during the monitoring operation an alarm signal is sent to the pump manager 91 who turns off the motor and provides a motor off signal to the stroke discriminator.

When the stroke discriminator 93 receives a motor on signal from the pump manager 91, it provides a start signal which causes the stroke derivative detector 109 to measure stroke derivative signal noise during a 3 second turn-on delay period. At the end of the 3 second delay the derivative detector 109 uses the measured noise and the stroke signals to provide upstroke and downstroke signals until the stroke discriminator 93 sends a stop message to the derivative detector.

The stroke extremes detector 111 (FIG. 19) provides a minimum stroke position, load at minimum stroke, maximum stroke position, load at maximum stroke; minimum load, stroke position at minimum load, maximum load, and stroke position at maximum load each time a status request is received from the stroke discriminator 93. At the time the status request is received a reset occurs and the calculation of a new set of extreme values is started. This process continues until a stop signal is received by the stroke extremes detector 111 from the stroke discriminator 93.

When the stroke area calculator 110 (FIG. 19) receives a start signal from the stroke discriminator 93 the area calculator receives downside and extreme reports which are used to calculate the upstroke load area and the total area of the dynagraph (FIG. 2). The calculated values of the areas are sent from the area calculator 110 to the stroke discriminator 93 in response to a status-request signal.

When a power on signal is received by the stroke discriminator (at A, FIG. 20) its memory is initialized and mailing lists of the state machines which want to receive reports are prepared. When the motor on signal at B is received from the pump manager the stroke discriminator (FIG. 20) moves from the motor off state to the motor starting state, starts a three second timer and sends a start X' noise measure message to the derivative detector to start its measurement of the noise on the stroke derivative during this three second period. When the three second motor on delay timer has expired (at C) the derivative detector 109 (FIG. 19), stroke area calculator 110 and stroke extremes detector 111 receive start messages and the BDC count is set to zero. The BDC position is the bottom dead center of the left end of the walking beam 22 (FIG. 1) and corresponds to the start of the downstroke of the sucker-rod string 15. A start report signal (at G, FIG. 20) from any of the state machines places the requesting machine on the specified mailing list if it is not already there. A stop report signal (at F) from any of the state machines removes the requesting machine from the specified mailing list.

When an upside signal (at H, FIG. 20) is received from the derivative detector, in the motor on state, if the BDC count is less than two the BDC count is incremented. A status request is sent to the extremes detector 111 (FIG. 19) and a BDC report is sent to all machines who have signed up via a start BDC report message as previously noted. When a downside signal (I, FIG. 20) is received from the derivative detector in the motor on state a TDC (top dead center relative to the outer end of the walking beam) report is sent to all who have signed up for such a report. A downside message is also sent to the stroke area calculator 110 (FIG. 19). When an extremes message (J, FIG. 20) is received from the stroke extremes detector 111 (FIG. 19) in the motor on state an extremes message is sent to the stroke area calculator, a status request is sent to the stroke area calculator, and a peak report is sent to all of the state machines who have signed up if the BDC count is at least two. When an area report (at K, FIG. 20) is received from the area calculator in the motor on state an area report is sent to all state machines who have signed up if the BDC count is at least two.

The stroke derivative detector 109 (FIG. 19) identifies the maximum and minimum stroke positions by using the zero crossing of the first derivative of the stroke signal (FIG. 17) from the stroke transducer 53 (FIG. 1). The first step in the operation is to determine a dead band or noise band about the zero crossing value (X'=0) as seen in FIGS. 17 and 18. A noise value "d" is a maximum difference between X' from the math utility and the X' smoothed by a fifteen point moving average, detected during the three second monitor period and corrected for phase shift. The noise band is used to declare that a top dead center (TDC) position has been reached when X' is greater that +d and a bottom dead center (BDC) position has been reached when X' is less than −d. The operation of the stroke derivative detector 109 (FIG. 19) is disclosed in detail in the state diagram of FIG. 21. When the system provides a power on signal (at A, FIG. 21) the derivative detector is initialized and requests a report of X' from the math utility (FIG. 19). The derivative detector also sets a blackout time to two seconds. At this point a subsequent start X' noise measurement signal from the stroke discriminator starts the derivative detector (at B, FIG. 21). A fifteen point moving average smooth of X' is initiated with the last previous value of the derivative used as a starting value and with the maximum noise set to a value of zero.

The start X' noise measurement message signal (at B, FIG. 21) moves the derivative detector into the X' noise monitor state (2). When a X value is received from the math utility it is smoothed. The absolute value of the difference between the smoothed and the raw values of X' is then computed. If this value is greater than the maximum noise value then the maximum noise is set to this value. When a start signal is received from the stroke discriminator (at E, FIG. 21) indicating that the three second noise measurement period is over, the X' zero noise band is set (FIGS. 17 and 18). The maximum noise value is then increased by a 10% safety margin and −d is set to −max noise and +d is set to +max noise (FIG. 18).

If the last X' value received is greater than zero then the increasing state is entered. If, however, the last X value is less than zero, then the decreasing state is entered. The derivative detector now monitors the X' values in order to detect the top and bottom of the stroke (FIG. 17).

The operation for the detection of the start of the upstroke (state 3 to 5 to 8 to 4, FIG. 21) is the same (except for the sense of direction) as the operation for the detection of the start of the downstroke which goes from state 4 to 6 to 7 to 3 so only the one detection operations will be discussed herein.

When the stroke derivative detector is in the decreasing state (3, FIG. 21) and a X' value is received from the math utility the X' value is checked against the upper end of the noise band +d. If the X' value is less than +d then no action is taken and the stroke discriminator detector remains in state 3. However, if X' is greater than +d then the signal has gone through the zero X' band in an increasing direction and therefore may have detected the negative position peak (TDC or end of downstroke and start of upstroke). However, it is possible that noise has caused a false detection, therefore a three point timer (time needed to acquire three data points at the data acquisition rate) is started and state 5 (FIG. 21) is entered. X' values are recorded in this state during the time required to collect the three points of data. When this time has expired X' is again compared to +d and if X' is less than +d a noise glitch has occurred. The zero noise band between +d and −d is increased by 10% or by a count of one, whichever is greater, and the stroke discriminator detector returns to state 3. If, however, X' is greater than the value d a negative position peak has been detected. A blackout timer is started, state 8 is entered and a downstroke message is sent to the stroke discriminator 93 (FIG. 19). During the blackout timer X' is not checked. Because of the cyclical nature of the pump stroke another peak is not expected until a known minimum time has passed. The use of the blackout time improves the noise immunity of the detector. When the blackout time has expired, X' math flow is started again, the increasing state (4) is entered and the system looks for the positive position peak. The process is the same as above except for the sense of the comparison as noted hereinbefore.

Details of the stroke extremes detector 111 (FIG. 19) which detects Xmax, Xmin, Ymax and Ymin values, is shown in the stroke extremes detector state diagram of FIG. 20. When power is turned on the stroke extremes detector moves into the idle state (1, FIG. 22). In response to a start signal (at B) from the stroke discriminator 93 (FIG. 19) the values Xlag and Ylag math flow are started and the extremes are initialized. In initializing the stroke extremes, Xmin is set to the maximum positive value used in the detector, Y at Xmin is set to the value of zero, Xmax is set to zero and Y at Xmax is set to a value of zero.

The stroke extremes detector (at C, FIG. 22) uses the Xlag signal from the math utility (FIG. 19) to calculate updated values of Xmax and Xmin and uses the Ylag signals (at D, FIG. 22) to calculate the updated values of Ymax and Ymin. The updated values of maximum and minimum for X and Y are calculated as follows. If X received is greater than Xmax then Xmax is set to the X value received and Y at Xmax is set to the corresponding Y value. The same procedure is done for Ymax. If X received is less than Xmin then Xmin is set to the X value received and Y at Xmin is set to the corresponding Y value and the same procedure is followed for Ymin. These values are sent to the stroke discriminator 93 (FIG. 25) in response to a status request (at E, FIG. 22) and the extremes are then initialized.

The stroke area detector 110 (FIG. 19) calculates the total dynagraph card area and the average upstroke area (FIG. 2) under the direction of the stroke discriminator 93. When a power on message is received (at A, FIG. 23) the status report total curve area and average upstroke area is set to a value of zero. When a start message is received from the stroke discriminator the stroke area calculator moves to the "wait for first report state". When a start of upstroke (D) or start of downstroke report (C) is received in the wait for first report state, the appropriate state either 3 or 4 is entered and the parameters are initialized. The buffer index (FIG. 24) and the total area are both set to an initial value of zero and the math flow is started. As the Ylag (load) values are received, these values are processed in the manner determined by the area calculator state (upstroke or downstroke).

Details of the method and apparatus for calculating the total area of the dynagraph are illustrated in FIG. 24 where the load values U1-Un are sampled at regular intervals during the upstroke and stored in memory positions M1-Mn of a load buffer LB1. At the start of each upstroke (FIG. 24) an index I1 is set to zero so it points to memory position M1 of buffer LB1 in the RAM 87a (FIG. 10A) and the total area is set to zero. At regular intervals on the upstroke each of the load values U1-Un are sampled and placed in one of the memory positions M1-Mn of buffer LB1 under the direction of the index I1. The index is then incremented to the next position.

The load values from the memory positions M1-Mn are added to obtain a value which is proportional to the area of the dynsgraph below the upstroke portion of the curve. This upstroke area value can be used to distinguish between different types of pump problems, such as the difference between the "parted rod" dynagraph of FIG. 3 and the "gas lock" dynagraph of FIG. 6. The gas lock dynagraph is nearer the PPRL line and the upstroke curve provides a larger area than the parted rod dynagraph.

The area between the upstroke curve and the downstroke curve is used in distinguishing between other types of pump problems using the upstroke load values U1-Un and the downstroke load values L1-Ln. On the downstroke as each of the new load values is received, the index I1 is decremented, each of the lower load values Ln–L1 is subtracted from the corresponding upper load values Un–U1, the difference is stored in buffer LB1 and the difference values are used to calculate the area of the dynagraph by slicing the dynagraph into small vertical strips, calculating the area of each strip and adding these strips areas to obtain the total area. For example, the lower load value L14 (FIG. 24) is subtracted from the corresponding upper load value U14 and multiplied by the width between boundaries B13 and B14 to obtain the area of the strip A14. Since only the relative areas of the dynagraph between different well conditions are needed the width of each strip can be assumed to have the value of one, even though the widths of the strips vary from one portion of the dynagraph to another. Each strip, such as strip A14 has substantially the same width each time the load values are sampled.

The area strips (FIG. 24) are shown as being relatively wide to simplify the diagram, but a greater number of load samples, resulting in narrower strips, can be used to increase the accuracy of the calculations. When a strip width of one is assumed it is necessary to merely subtract each load value L1–Ln from the corresponding load value U1–Un to obtain the area of each strip.

The power on message also causes the pump manager software state machine module 91 (FIG. 25) to provide power to the pump motor 30 (FIG. 10A) through interface 75a and a motor relay 98. A "power on" message to the pump problem detector 92 (A, FIG. 26) moves this state machine into the start wait state. The motor 30 (FIG. 1) moves the sucker-rod string 15 through a predetermined number of start up ignore cycles to allow the fluid level in the well to stabilize, then the pump manage module 91 (FIG. 25) sends a "start" message to the pump problem detector 92 which moves the pump problem detector (B, FIG. 26) from the "start wait" state to the calibration state if a calibration has not been previously carried out. If the pump problem detector has been calibrated the detector moves into the "pump problem monitor" state.

During calibration the stroke discriminator 93 (FIGS. 25, 26) sends an area report to the pump problem detector 92 at the start of each downstroke. This area report includes the total dynagraph area and the average upstroke area. The pump problem detector calibration period includes one full pumping episode from motor turn on to motor off. During this calibration period the average upstroke area is checked for each cycle of the sucker-rod and a running maximum value and a running minimum value are saved (FIG. 9) in a nonvolatile memory 85 (FIG. 10A) for use in the pump problem monitor the next time the pump motor 30 is turned on. This calibration technique permits the pump problem detector to automatically adapt itself to any number of wells.

After the pump problem detector 92 (FIG. 25) has calibrated itself, it starts monitoring for pump problems at the receipt of the next "start" message. The detector activate threshold and the detect threshold (FIG. 9) are established using the average upstroke load max and average upstroke load min values from the nonvolatile memory 85 (FIG. 10A). The mean upstroke load (FIG. 9) is first determined as the arithmetic mean of the average upstroke max load and the average upstroke min load values. Next the value of delta is calculated as the difference between the average upstroke max value and the average upstroke min value. The activate threshold value is then established as the minimum of a fixed percentage of the mean value (such as 80%) or the mean of the upstroke load less the a first constant (K1) times the value of delta and the detect threshold is established as the mean value of the upstroke load less a second constant (K2) times the delta value.

The values of K1 and K2 were determined by experimentation under field conditions and were chosen as 6 and 8 respectively. The constant K2 should have a value of at least one greater than the value of K1 to provide a hystersis of at least the value of delta between the activate and the detect threshold levels. The activate and detect thresholds are set relative to the stability of the upstroke load for the well in which the present apparatus is used. If there is a very small change in the normal upstroke load value, the thresholds can be set near the actual operating values to obtain a high detection sensitivity. If there are significant changes in the operating upstroke load value the thresholds will be further away from the actual values and the sensitivity will be low.

During the monitor period the area report is received from the stroke discriminator 93 (FIGS. 25, 26) at the start of each downstroke and the upstroke load value is saved. At this same time the minimum and maximum load values are updated. If the current average upstroke load is greater than the activate threshold (FIG. 9) the pump problem detector is activated. The incorporation of the activate threshold prevents false detection in case the well pump has been off for a considerable length of time, resulting in a high static fluid level (FIG. 5), and therefore, resulting in a reduced value of upstroke load. This also provides for detection of a deep rod part in a full well.

The detector is enabled whenever the pump is turned on, and the upstroke area is normally equal to or greater than the activate threshold. Any sudden decrease in upstroke area as a result of one of the aforementioned pump problems will be readily detected. However, if the pump is turned on in a full well where the upstroke area is already significantly reduced to a position below the activate threshold the detector is not activated and a false detection will not occur. This condition can be noted as a possible pump problem. If a pump problem, such as a rod part does not exist, the well will be pumped down in the normal manner and the upstroke area will increase until the area has moved above the activate threshold. When this occurs, the pumping system can be assumed to be operating properly and the prior possible rod part can be dismissed. With the increased upstroke area, pump problems, such as rod part can be detected in the normal manner.

If the well does not pump down in the normal manner, so the dynacard upstroke area remains in a reduced state, then ultimately the maximum permissible pump run time will be exceeded and the pump will be halted. If at this time, there is a possible rod part indicated, the possible rod part condition can be set as a "definite" rod part, thereby correctly detecting the failure for the previously "impossible-to-detect" case. The maximum on time parameter must be set by the human operator to the maximum time required for his well to pump down from a full well condition to a fluid pound condition. When the detector is active and the current average upstroke load falls below the detect threshold level the pump problem count is incremented. When the pump problem count reaches a predetermined number selected by the human operator (such as three violations)

a pump problem is reported to the pump manager 91 (FIG. 25). The pump manager then turns off the pump motor, disabling the pumping system.

Whenever the pump motor 30 (FIG. 1) is turned off the minimum and maximum values of average upstroke load for the current pumping episode are averaged with the minimum and maximum values of upstroke load saved in the nonvolatile memory 85 (FIG. 10A) to obtain a long term average of these minimum and maximum values. The new long term value is calculated as follows:

$$\text{New value} = \text{old value} - \frac{1}{N}(\text{old value}) + \frac{1}{N}(\text{current value})$$

where N is the number of episodes of moving average used to set the detector threshold. In the present invention a value of thirteen is used for N.

A method of isolating the type of pump problem is disclosed in the flow chart of FIG. 27. Tests are made on the total area, on the upstroke area and on the dynagraph slope (overtravel of the rod string versus undertravel) (FIG. 27) to separate pump problems into the following groups:

1. Rod part, low tubing leak, traveling valve stuck open, traveling valve and standing valve stuck open;
2. Pump stuck at the top of the working barrel;
3. Pump stuck at the bottom of the working barrel;
4. Standing valve stuck open; and
5. Gaslock.

If the detector is sound to be active the total dynagraph area is checked to see if there has been a decrease in the total area. A decrease in the total area indicates a pump problem which could be caused by:
(1) Rod part (FIG. 3);
(2) Low tubing leak (FIG. 3);
(3) Traveling valve and standing valve stuck open (FIG. 3);
(4) Pump stuck at the top of the pumping chamber (FIG. 4);
(5) Traveling valve stuck open (FIG. 3);
(6) Gas lock (FIG. 6);
(7) Standing valve stuck open (FIG. 6);
(8) Pump stuck at the bottom of the pumping chamber (FIG. 4); and
(9) A worn pump (FIG. 7).

When there is a decrease in total area, if it is accompanied by a decrease in average upstroke load or in upstroke area then the problem is classified as a category B problem and includes the following:
(1) Rod part;
(2) Low tubing leak; p0 (3) Traveling valve and standing valve stuck open;
(4) Pump stuck at the top of the pumping chamber; and
(5) Traveling valve stuck open.

If one additional test is performed on the category B problems these can be further categorized. The additional tests involves checking the slope of the dynagraph and if there is a significant undertravel the problem can be clearly categorized as a pump stuck at the top of the pumping chamber. If, however, there is no undertravel detected in the dynagraph then the problem is one of the following:
(1) Rod part;
(2) Low tubing leak;
(3) Traveling valve stuck open; and
(4) Traveling valve and standing valve stuck open.

When there is a decrease in total area, if there is no decrease in average upstroke load or upstroke area then the problem is classified as a category B problem and includes:
(1) Gas lock;
(2) Standing valve stuck open; and
(3) Pump stuck at the bottom of the pumping chamber. If the dynagraph shows that there is undertravel then the problem is a pump plunger stuck at the bottom of the pumping chamber.

If there is no undertravel in the dynagraph then the problem is either gas lock or the traveling valve is stuck open. If this test fails for several consecutive pumping episodes then the problem is the standing valve stuck open. If, however, the problem clears itself then it is due to gas lock. In the case of the gas lock the pump can be turned off for some period of time and then can be turned on again. For all other problems, the pump is turned off and must remain off until the problem has been corrected.

A simplified procedure for checking the type of pump problems is disclosed in the flow chart of FIG. 28. If the detector is not active and the maximum running time for the pump has been exceeded, then a pump problem is indicated as previously discussed and the pump is shut down.

If the detector is active and the average upstroke area has fallen below the detection threshold, then a pump problem is indicated (rod part, low tubing leak, traveling valve and standing valve stuck open, pump plunger stuck at the top, traveling valve stuck open) and the pump is shut down. The exact cause however is not determined.

Pump problems such as gas lock, standing valve stuck open and pump plunger stuck at the bottom, where there is no significant decrease in upstroke area are not detected by this detector. These are detected by other detectors not covered here, for example, gas lock can be detected by a fluid pound detector.

The present invention provides means for using sucker-rod load signals and sucker-rod position signals to calibrate a well having a properly operating well pumping unit. A dynacard of sucker-rod position versus sucker-rod load for the properly operating well is obtained and compared with dynacards which are plotted during well production. A computer compares the characteristics of the production dynacard with the characteristics of the normal dynacard to detect any problem that developes. The abnormal dynacard characteristics are then checked against the characteristics of known pump problems to determine the exact nature of the pump problem.

Although the best mode contemplated for carrying out the present invention has been herein shown and described, it will be apparent that modification and variation may be made without departing from what is regarded to be the subject matter of the invention.

What is claimed is:

1. Apparatus for automatically detecting and classifying pump problems in a well pumping unit having a deep well pump connected to a sucker-rod string and a power unit to reciprocate said rod string to produce fluid from an underground location, said apparatus comprising:

first transducer means for generating a signal representative of a load on said rod string;

second transducer means for generating a signal representative of a position of said rod string;

means for using said load signals and said position signals to obtain a plurality of characteristic values from a calibration dynagraph with said pumping unit operating in an acceptable mode during a calibration period;

means for storing said characteristic values from said calibration dynagraph;

means for processing said load signals and said position signals to obtain a well dynagraph as said power unit operates to produce fluid from said underground location; and means for comparing a plurality of predetermined characteristic values of said well dynagraph with corresponding characteristic values of said calibration dynagraph to detect and classify said pump problems.

2. Apparatus for automatically detecting as defined in claim 1 including means for halting the operation of said pumping unit when said comparison means determines that a problem is present in said pumping unit.

3. Apparatus as defined in claim 1 wherein said means for comparing includes means for calculating the area of said well dynagraph, and means for comparing the area of the well dynagraph with the area of the calibration dynagraph to determine the type of problem in a faulty pumping unit.

4. Apparatus as defined in claim 1 including means for calculating an average load on the upstroke of said rod string when said pumping unit is operating properly, and means for comparing an operating upstroke load with said proper upstroke load to determine the type of problem when a problem occurs in said pumping unit.

5. Apparatus for automatically detecting pump problems in a well pumping unit having a deep well pump connected to a sucker-rod string and a power unit to reciprocate said rod string to produce fluid from an underground location, said apparatus comprising:

first transducer means for generating a signal representative to a load on said rod string;

second transducer means for generating a signal representative of a position of said rod string;

first and second computer means;

means for connecting said first and said second transducers to said first computer for processing said load signal and said position signal;

means for interconnecting said first and second computers for the interchange of signals;

an XY plotter;

means for connecting said XY plotter to said second computer for producing dynagraphs in response to said load signal and said position signal;

means for using said first computer for storing predetermined characteristics of a calibration dynagraph with said pumping unit operating in an acceptable mode during a calibration period; and means for comparing values of a plurality of predetermined characteristics of a well producing dynagraph with values of corresponding characteristics of said calibration dynagraph to detect and classify said pump problems as said pump is operating to produce fluid from said underground location.

6. Apparatus as defined in claim 5 wherein said means for connecting said first and said second transducers to said first computer includes an analog-to-digital converter for developing digital load and position signals for use by said first computer.

7. Apparatus as defined in claim 5 wherein said means for connecting said XY plotter to said second computer includes a digital-to-analog converter for providing analog load and position signals for use by said XY plotter.

8. Apparatus for automatically detecting pump problems in a well pumping unit having a deep well pump connected to a sucker-rod string and a power unit to reciprocate said rod string to produce fluid from an underground location, said apparatus comprising:

first transducer means for generating a signal representative of a load on said rod string;

second transducer means for generating a signal representative of a position of said rod string;

means for using said load signals and said position signals to obtain characteristic values from a calibration dynagraph with said pumping unit operating in an acceptable mode during a calibration period;

means for storing said characteristic values of said calibration dynagraph;

means for comparing an area of an updated dynagraph with an area of said calibration dynagraph to determine when the area of said updated dynagraph has decreased a predetermined amount;

means for using said characteristic values of said updated dynagraph and of said calibration dynagraph to determine when the load on said rod string has decreased by a predetermined amount;

means for using said characteristic values of said updated dynagraph and of said calibration dynagraph to determine when the travel of said rod string has decreased by a predetermined amount; and means for using said change in said dynagraph area, said change in said rod string load, and said change in said rod string travel to determine the type of pumping unit problem which caused changes in said dynagraphs.

9. Apparatus as defined in claim 8 including means for halting operation of said pumping unit when said predetermined decrease in dynagraph area is detected.

10. Apparatus as defined in claim 8 including means for using the value of said updated dynagraph area to catagorize the operation of said pumping unit into a normal or a problem condition, means for using the value of said rod string load to further catagorize the problem condition of said pumping unit into a subcondition and means for using the amount of said rod string travel to further catagorize the subcondition of said pumping unit to determine the type of pumping problem.

11. A method of automatically detecting and classifying a plurality of pump problems in a well pumping unit, said unit having a deep well pump connected to a sucker-rod string, means to reciprocate said string to pump fluid, means for generating a signal representative of load on said rod string, means for generating a signal representative of a position of said rod string, and computer means for processing said load and said position signals to detect and classify said pump problems, said method comprising the steps of:

using said load signal and said position signal to obtain a calibration dynagraph when said pumping unit is operating in a normal manner;

using said load signal and said position signal to continually develop updated dynagraphs while said pumping unit is working; and comparing a plurality of values of predetermined characteristics of said updated dynagraphs with values of corresponding characteristics of said calibration dynagraph to detect and classify said pump problems.

12. A method of automatically detecting and classifying pump problems in a well pumping unit, said unit having a deep well pump connected to a sucker-rod string, means to reciprocate said string to pump fluid, means for generating a signal representative of a load on said rod string, means for generating a signal representative of a position of said rod string, and computer means for processing said load and said position signals to detect and classify said pump problems, said method comprising the steps of:

using said load signal and said position signal to obtain a calibration dynagraph when said pumping unit is operating in a normal manner;

obtaining the area of said calibration dynagraph;

obtaining the values of load on said rod string during the rod string upstroke when said pumping unit is operating in a normal manner;

using said load signal and said position signal to continually develop updated dynagraphs while said pumping unit is working;

comparing the area of said updated dynagraph with the area of said calibration dynagraph to detect and classify any pump problems; and comparing the values of the working upstroke load with said normal upstroke load values to further classify the type of pump problem which has been detected.

13. A method of detecting pump problems as defined in claim 12 including the further step of:

comparing the travel distance of said working rod string with the travel distance of said normal rod string to further define the type of pump problem.

14. A method of detecting pump problems as defined in claim 12 including the further step of:

stopping said pumping unit when a pump problem has been detected.

* * * * *